United States Patent
Yamashita et al.

(10) Patent No.: US 8,780,248 B2
(45) Date of Patent: Jul. 15, 2014

(54) IMAGE PICKUP APPARATUS AND IMAGE PICKUP SYSTEM

(71) Applicant: Canon Kabushiki Kaisha, Tokyo (JP)

(72) Inventors: Yuichiro Yamashita, Hsinchu (TW); Masahiro Kobayashi, Tokyo (JP); Itsutaku Sano, Tokyo (JP); Takeshi Kojima, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/766,504

(22) Filed: Feb. 13, 2013

(65) Prior Publication Data

US 2013/0215305 A1 Aug. 22, 2013

(30) Foreign Application Priority Data

Feb. 17, 2012 (JP) ................................. 2012-033363

(51) Int. Cl.
 *H04N 3/14* (2006.01)
 *H01L 31/062* (2012.01)

(52) U.S. Cl.
 USPC ........ 348/302; 250/208.1; 257/291; 348/301; 348/308

(58) Field of Classification Search
 USPC ............................ 348/301–302, 308; 257/291
 See application file for complete search history.

(56) References Cited

U.S. PATENT DOCUMENTS

| 2011/0121162 A1* | 5/2011 | Murata et al. | 250/208.1 |
| 2011/0241089 A1* | 10/2011 | Ohri et al. | 257/291 |
| 2012/0153126 A1* | 6/2012 | Oike et al. | 250/208.1 |
| 2013/0214129 A1* | 8/2013 | Kobayashi et al. | 250/208.1 |

FOREIGN PATENT DOCUMENTS

JP 2011-216969 A 10/2011

* cited by examiner

*Primary Examiner* — Ngoc-Yen Vu
(74) *Attorney, Agent, or Firm* — Canon USA, Inc. IP Division

(57) ABSTRACT

One or more embodiments relate to an image pickup apparatus including multiple pixels. Each of the multiple pixels includes a photoelectric-conversion unit, and an amplifier which outputs a signal based on charge generated by the photoelectric-conversion unit. Within an electric path between the photoelectric-conversion unit and an input node of the amplifier, there are disposed a first holder, a second holder disposed following the first holder, a first transfer unit which transfers charge to the first holder, a second transfer unit which transfers charge of the first holder to the second holder, and a third transfer unit which transfers charge of the second holder. The first holder includes a first-conductive-type first semiconductor region holding charge. The second holder includes a first-conductive-type second semiconductor region holding charge. Impurity concentration of the first semiconductor region is lower than impurity concentration of the second semiconductor region.

6 Claims, 15 Drawing Sheets

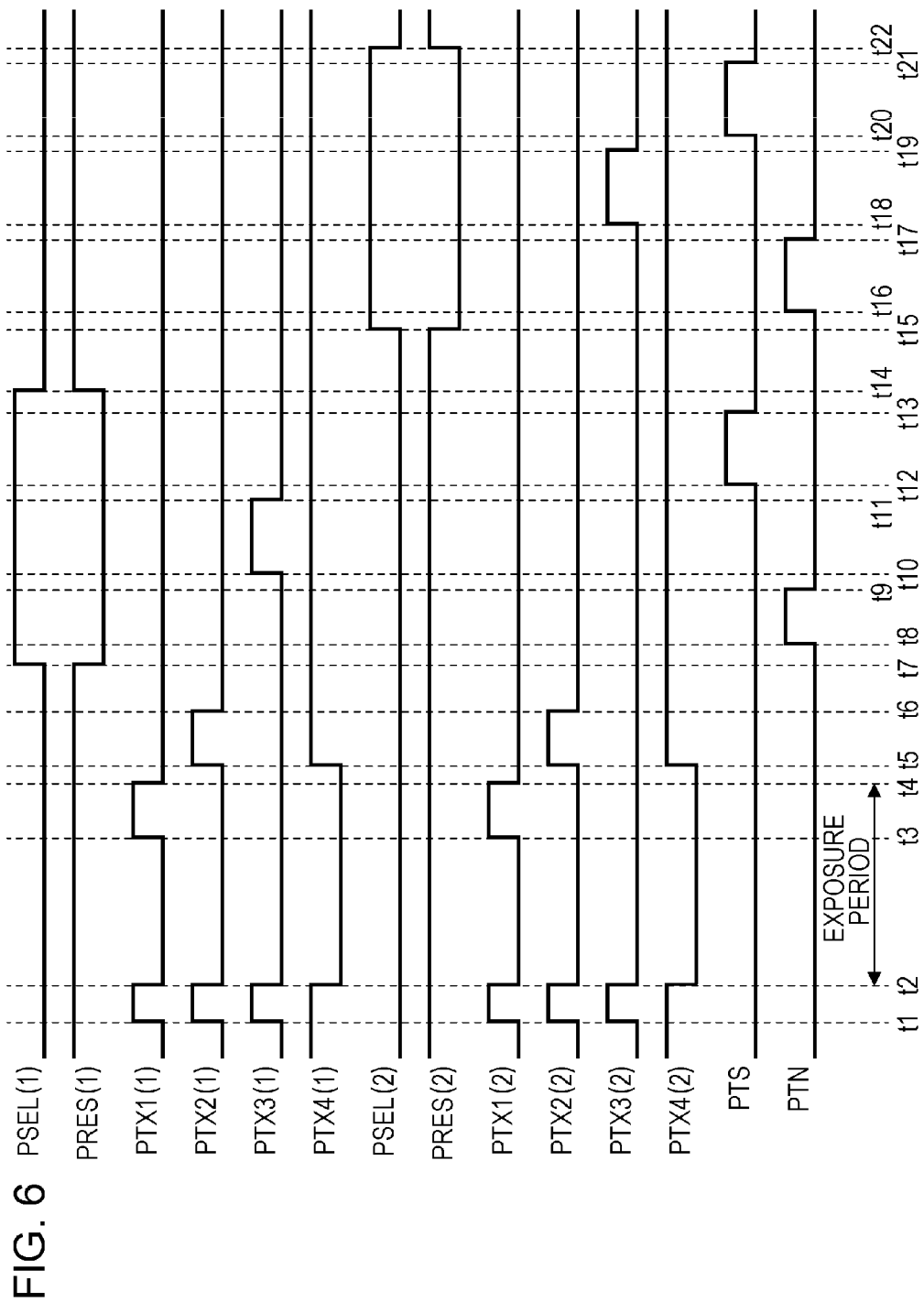

IMAGE PICKUP APPARATUS AND IMAGE PICKUP SYSTEM

BACKGROUND OF THE INVENTION

1. Field of the Invention

One disclosed aspect of the embodiments relates to an image pickup apparatus and an image pickup system.

2. Description of the Related Art

In recent years, owing to further improvement in the performance of image pickup apparatuses, there has been studied a configuration including a charge holding unit within a pixel separately from a photoelectric conversion unit and a floating diffusion (hereinafter, FD). As for usage of the holding unit, the holding unit is provided to realize a global electronic shutter as disclosed in Japanese Patent Laid-Open No. 2011-216969.

SUMMARY OF THE INVENTION

One or more embodiments relate to an image pickup apparatus including multiple pixels. Each of the multiple pixels includes a photoelectric conversion unit, and an amplifier element configured to output a signal based on charge generated by the photoelectric conversion unit. Within an electric path between the photoelectric conversion unit and an input node of the amplifier element, there are disposed a first holding unit, a second holding unit disposed in a subsequent stage of the first holding unit, a first transfer unit configured to transfer charge to the first holding unit, a second transfer unit configured to transfer charge of the first holding unit to the second holding unit, and a third transfer unit configured to transfer charge of the second holding unit. The first holding unit includes a first conductive-type first semiconductor region which holds charge. The second holding unit includes a first conductive-type second semiconductor region which holds charge. Impurity concentration of the first semiconductor region is lower than impurity concentration of the second semiconductor region.

One or more embodiments relate to an image pickup apparatus including multiple pixels. Each of the multiple pixels includes a photoelectric conversion unit, and an amplifier element configured to output a signal based on charge generated by the photoelectric conversion unit. Within an electric path between the photoelectric conversion unit and an input node of the amplifier element, there are disposed a first holding unit, a second holding unit disposed in a subsequent stage of the first holding unit, a first transfer unit configured to transfer charge to the first holding unit, a second transfer unit configured to transfer charge of the first holding unit to the second holding unit, and a third transfer unit configured to transfer charge of the second holding unit. The first holding unit includes a first conductive-type first semiconductor region which holds charge. The second holding unit includes a first conductive-type second semiconductor region which holds charge. A lower end of the first semiconductor region is disposed in a shallower position than a lower end of the second semiconductor region.

One or more embodiments relate to an image pickup apparatus including multiple pixels. Each of the multiple pixels includes a photoelectric conversion unit, and an amplifier element configured to output a signal based on charge generated by the photoelectric conversion unit. Within an electric path between the photoelectric conversion unit and an input node of the amplifier element, there are disposed a first holding unit, a second holding unit disposed in a subsequent stage of the first holding unit, a first transfer unit configured to transfer charge to the first holding unit, a second transfer unit configured to transfer charge of the first holding unit to the second holding unit, and a third transfer unit configured to transfer charge of the second holding unit. The first holding unit includes a first conductive-type first semiconductor region which holds charge. The second holding unit includes a first conductive-type second semiconductor region which holds charge. The first semiconductor region includes a first portion, and a second portion of which impurity concentration is lower than that of the first portion.

One or more embodiments relate to an image pickup apparatus including multiple pixels. Each of the multiple pixels includes a photoelectric conversion unit, and an amplifier element configured to output a signal based on charge generated by the photoelectric conversion unit. Within an electric path between the photoelectric conversion unit and an input node of the amplifier element, there are disposed a first holding unit, a second holding unit disposed in a subsequent stage of the first holding unit, a first transfer unit configured to transfer charge to the first holding unit, a second transfer unit configured to transfer charge of the first holding unit to the second holding unit, and a third transfer unit configured to transfer charge of the second holding unit. The first holding unit includes a first conductive-type first semiconductor region which holds charge. The second holding unit includes a first conductive-type second semiconductor region which holds charge. The image pickup apparatus further includes a second conductive-type third semiconductor region. At a depth where the third semiconductor region is disposed, a first portion of the first semiconductor region is disposed between the third semiconductor region and the first transfer unit. At the depth where the third semiconductor region is disposed, a second portion of the first semiconductor region is disposed between the third semiconductor region and the second transfer unit.

One or more embodiments relate to an image pickup apparatus including multiple pixels. Each of the multiple pixels includes a photoelectric conversion unit, and an amplifier element configured to output a signal based on charge generated by the photoelectric conversion unit. Within an electric path between the photoelectric conversion unit and an input node of the amplifier element, there are disposed a first holding unit, a second holding unit disposed in the subsequent stage of the first holding unit, a first transfer unit configured to transfer charge to the first holding unit, a second transfer unit configured to transfer charge of the first holding unit to the second holding unit, and a third transfer unit configured to transfer charge of the second holding unit. The first holding unit includes a first conductive-type first semiconductor region which holds charge. The second holding unit includes a first conductive-type second semiconductor region which holds charge. When the first transfer unit, the second transfer unit, and the third transfer unit are in a non-conductive state, potential of the first semiconductor region is higher than potential of the second semiconductor region.

Further features of the disclosure will become apparent from the following description of exemplary embodiments with reference to the attached drawings.

BRIEF DESCRIPTION OF THE DRAWINGS

FIG. 6 is a diagram illustrating driving pulses of an embodiment of the image pickup apparatus.

DESCRIPTION OF THE EMBODIMENTS

One disclosed feature of the embodiments may be described as a process which is usually depicted as a timing diagram. A timing diagram may illustrate the timing relationships of several entities, such as signals, events, etc. Although a timing diagram may describe the operations as a sequential process, some operations may be performed in parallel or concurrently. In addition, unless specifically stated, the order of the operations or timing instants may be re-arranged. Furthermore, the timing or temporal distances may not be scaled or depict the timing relationships in exact proportions.

According to one or more embodiments, with an image pickup apparatus which includes multiple charge holding units within a pixel separately from a photoelectric conversion unit and a floating diffusion, transfer efficiency of charge from a first charge holding unit to a second charge holding unit may be improved.

The image pickup apparatus includes a photo diode, a first memory unit which holds signal charge generated at the photodiode, and a second memory unit which holds signal charge to be transferred from the first memory unit within a pixel. The first memory unit and second memory unit may have the same configuration.

However, with such an image pickup apparatus, there is a problem wherein it is difficult to transfer charge from the first memory unit to the second memory unit. This is because the two memory units have the same configuration, and accordingly, potentials of both have almost the same height in the event of the same bias conditions. As a result thereof, transfer efficiency of charge from the first memory unit to the second memory unit may deteriorate.

In particular, in the event of performing complete depletion transfer of charge from the first memory unit to the second memory unit, this problem becomes prominent. A reason thereof is in that complete depletion transfer of charge is performed by lowering the potential of the second memory unit than the potential of the first memory unit. In the event that the first memory unit and second memory unit have the same configuration, it has been difficult to lower the potential of the second memory unit than the potential of the first memory unit.

Figure 2:
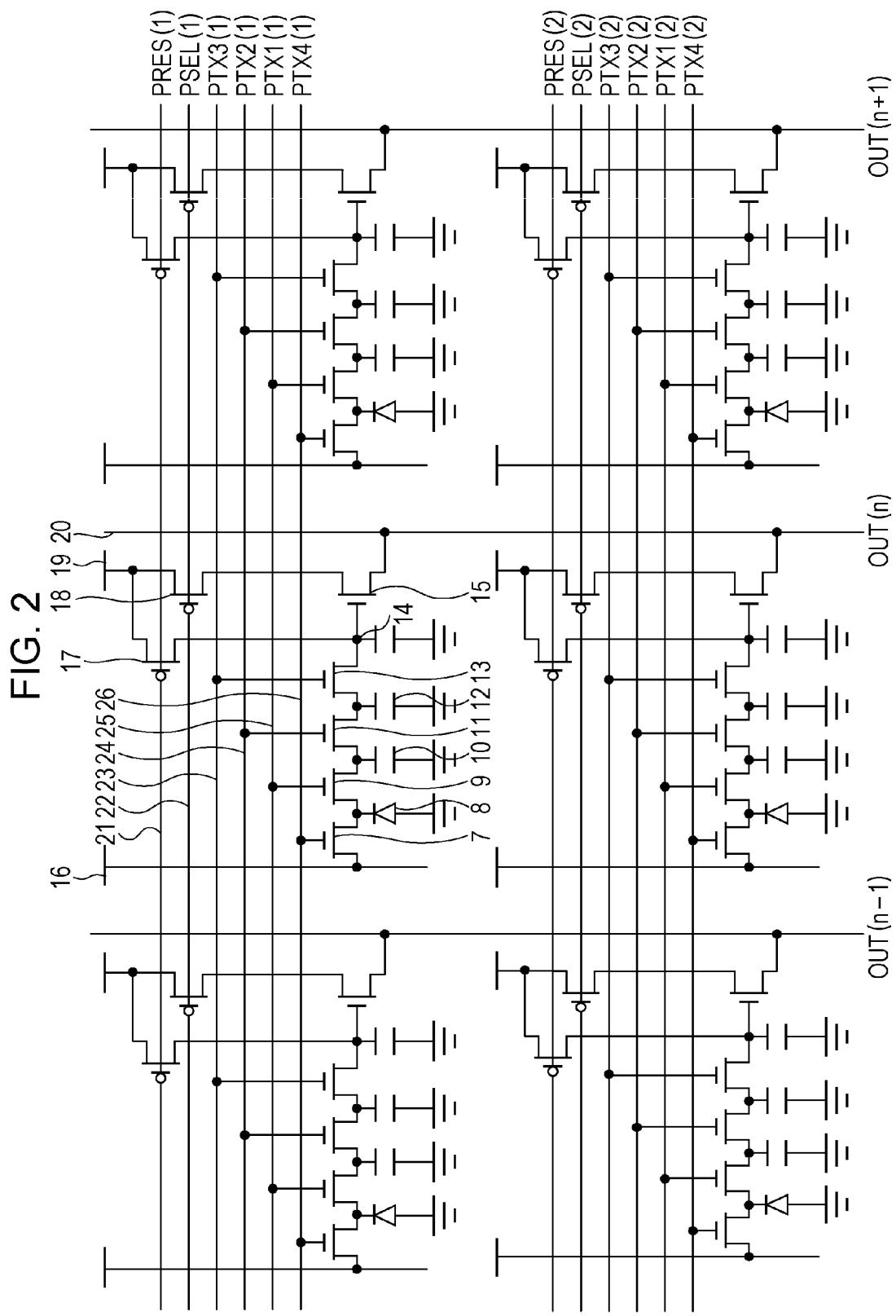
FIG. 2 is a diagram illustrating an equivalent circuit of an embodiment of the image pickup apparatus.

Embodiments will be described with reference to the drawings. The image pickup apparatus according to one or more embodiments includes multiple pixels. FIG. 2 illustrates an example of equivalent circuits of pixels of the image pickup apparatus. As illustrated in FIG. 2, the pixels include a photoelectric conversion unit 8, a first holding unit 10 which holds charge at a place different from the photoelectric conversion unit 8, and a second holding unit 12 which holds charge held by the first holding unit 10 at a place different from the photoelectric conversion unit 8 and first holding unit 10.

Further, the pixels include a first charge transfer unit 9 which transfers charge to the first holding unit 10, a second charge transfer unit 11 which transfers charge at the first holding unit 10 to the second holding unit 12, and a third charge transfer unit 13 which transfers charge at the second holding unit 12. With the charge transfer units, the potentials of semiconductor regions (channels 304, 305, and 306) below control electrodes are controlled by voltage to be supplied to the control electrodes. Fixed voltage or multiple types of voltage are supplied to the control electrodes.

Figure 7A:
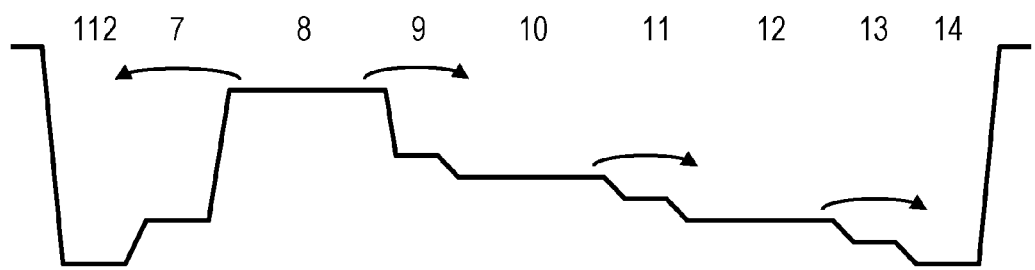
FIGS. 7A to 7D are schematic diagrams representing potential of an embodiment of the image pickup apparatus.
Figure 7B:
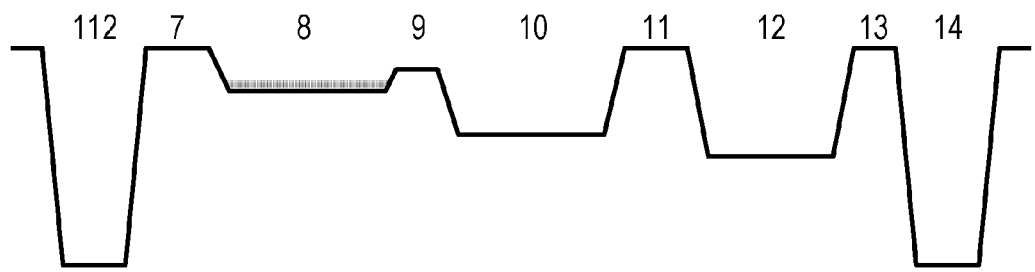

FIGS. 7A to 7D illustrate an example of potential states at the pixels of the image pickup apparatus according to one or more embodiments. Here, as illustrated in FIG. 7B, it is a feature of one or more embodiments that in the event that voltage has been applied to the control electrodes of the three charge transfer units whereby the charge transfer units are placed in a non-conductive state, the potential of the first holding unit 10 is higher than the potential of the second holding unit 12.

That the charge transfer units are in a non-conductive state is a state in which in the event of multiple types of voltage being applied to the control electrodes, voltage to increase the potential of a channel for signal charge has been applied. Also, in the event of fixed voltage being applied to the control electrodes, the charge transfer units are in a non-conductive state.

Note that each of the first holding unit 10 and second holding unit 12 may include a control electrode. Therefore, with such an image pickup apparatus, voltage to be applied to the control electrodes of the holding units will be described at the time of comparing the potentials of the first holding unit 10 and second holding unit 12. First, in the event that the control electrode of the first holding unit 10 is shared with the control electrode of the first charge transfer unit 9, voltage that causes the first charge transfer unit 9 to be in a non-conductive state is supplied to the control electrode of the first holding unit 10. Similarly, in the event that the control electrode of the second holding unit 12 is shared with the control electrode of the second charge transfer unit 11, voltage that causes the second charge transfer unit 11 to be in a non-conductive state is supplied to the control electrode of the second holding unit 12. Next, in the event that voltage is independently supplied to the control electrodes of the holding units, the potentials have to be compared in a state in which the same voltage is applied to the control electrodes of the two holding units.

According to such a configuration, transfer of charge from the first holding unit 10 to the second holding unit 12 may effectively be performed.

With one or more embodiments, impurity concentration of a first conductive-type second semiconductor region which makes up the second holding unit 12 is higher than impurity concentration of a first conductive-type first semiconductor region 103 of which makes up the first holding unit 10. According to such a configuration, increasing the potential of the first holding unit 10 as compared to the potential of the second holding unit 12 is facilitated. As one reason thereof, this is because when the impurity concentration is high, high voltage is employed due to formation of a depletion layer. In other words, this is because great reverse bias may be applied to the second semiconductor region having high impurity concentration.

With one or more embodiments, the lower end of the first conductive-type second semiconductor region which makes up the second holding unit 12 is in a deeper position of the substrate than the lower end of the first conductive-type first semiconductor region 103 which makes up the first holding unit 10. According to such a configuration, increasing the potential of the first holding unit 10 as compared to the potential of the second holding unit 12 is facilitated. As one reason thereof, this is because the greater the volume of a semiconductor region is, the higher the voltage employed for depletion of the entirety thereof is. In other words, this is because great reverse bias may be applied to the second semiconductor region.

With one or more embodiments, the first conductive-type first semiconductor region 103 which makes up the first holding unit 10 includes a first portion and a second portion of which the impurity concentration is lower than the first portion. According to such a configuration, increasing the potential of the first holding unit 10 as compared to the potential of the second holding unit 12 is facilitated.

With one or more embodiments, a second conductive-type third semiconductor region of which the side face is surrounded with the first semiconductor region 103 is disposed. According to such a configuration, increasing the potential of the first holding unit 10 as compared to the potential of the second holding unit 12 is facilitated.

Hereinafter, embodiments will be described. "first conductive-type" and "second conductive-type" to be used in the present Specification are terms to be used for expressing mutually different conductive types. In the event that "first conductive-type" is the N-type, "second conductive-type" is the P-type. In the event that "first conductive-type" is the P-type, "second conductive-type" is the N-type. Hereinafter, for simplification of description, an example will be described wherein "first conductive-type" is the N-type, and "second conductive-type" is the P-type. However, the disclosure is not restricted to this, and embodiments may also be applied to a case where "first conductive-type" is the P-type, and "second conductive-type" is the N-type. In the event that the semiconductor region which makes up a holding unit is the N-type, of an electron and a positive hole generated by photoelectric conversion, the electron is accumulated in the holding unit. In the event that the semiconductor region which makes up a holding unit is the P-type, of an electron and a positive hole generated by photoelectric conversion, the positive hole is accumulated in the holding unit.

Also, hereinafter, an embodiment of a pixel-amplification-type image pickup apparatus including an amplifier element for each pixel will be described. Though not restricted to this, one or more embodiments may include a charge holding unit, and various sensors having a transfer unit which transfers charge held at a holding unit.

First Embodiment

An embodiment of the image pickup apparatus will be described. With some embodiments, pixels include the first holding unit 10 and second holding unit 12. A feature thereof is in that the impurity concentration of an N-type semiconductor region which makes up the second holding unit 12 is higher than the impurity concentration of the N-type semiconductor region 103 which makes up the first holding unit 10.

Figure 1:
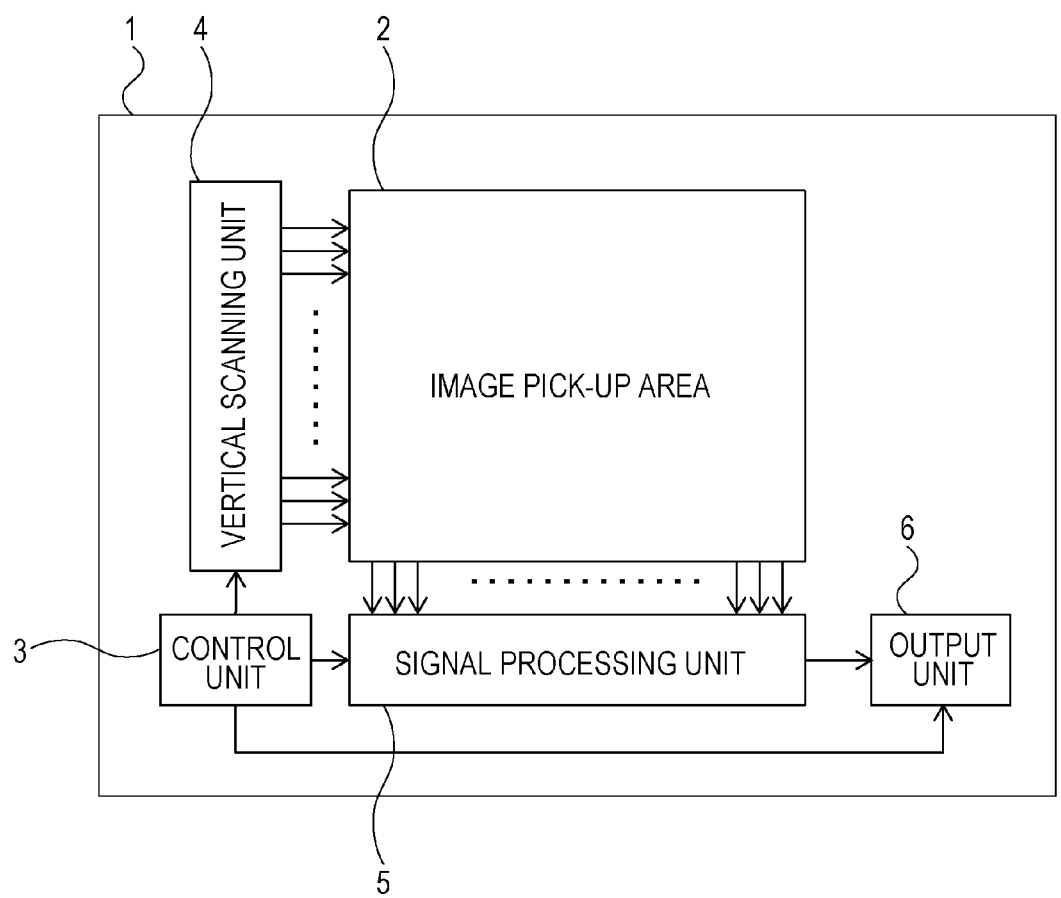
FIG. 1 is a block diagram of an embodiment of an image pickup apparatus.

FIG. 1 is an overall block diagram of image pickup apparatuses according to some embodiments. An image pickup apparatus 1 may be configured of one chip using a semiconductor substrate. The image pickup apparatus 1 includes multiple pixels disposed in an image pickup area 2. Further, the image pickup apparatus 1 includes a control unit 3. The control unit 3 supplies a control signal, power supply voltage, and so forth to a vertical scanning unit 4, a signal processing unit 5, and an output unit 6.

The vertical scanning unit 4 supplies a driving pulse to multiple pixels disposed in the image pickup area 2. Usually, the vertical scanning unit 4 supplies a driving pulse for each pixel row or for every multiple pixel rows. The vertical scanning unit 4 may be configured of a shift register or address decoder.

The signal processing unit 5 is configured to include a column circuit, a horizontal scanning circuit, and a horizontal output line. The column circuit is configured of multiple circuit blocks which each receive the signals of multiple pixels included in a pixel row selected by the vertical scanning unit 4. Each of the circuit blocks may be configured of one or all of a memory unit, an amplifier circuit, a denoising circuit, and an analog-to-digital conversion circuit, or a combination of these. These circuits may be a circuit which processes digital signals or may be a circuit which processes analog signals. The horizontal scanning circuit may be configured of a shift register or address decoder.

The output unit 6 outputs a signal transmitted via a horizontal output line out of the image pickup apparatus 1. The output unit 6 is configured to include a buffer or amplifier circuit.

FIG. 2 illustrates an equivalent circuit of image pickup apparatuses according to some embodiments. Here, though six pixels in a total of two rows by three columns are illustrated, an image pickup area may be configured by an even greater number of pixels being disposed.

The photoelectric conversion unit 8 converts incident light into signal charge (electron or positive hole). A photodiode is illustrated as an example of the photoelectric conversion unit 8.

The first charge transfer unit 9 transfers charge generated at the photoelectric conversion unit 8 to a circuit element on the subsequent stage. Hereinafter, a case where electrons are employed as signal charge will be described as an example. The first charge transfer unit 9 is configured to include a control electrode disposed on the semiconductor substrate via an insulating film.

The first holding unit 10 holds electrons generated at the photoelectric conversion unit 8. The second charge transfer unit 11 transfers the electrons held at the first holding unit 10 to a circuit element on the subsequent stage. The second charge transfer unit 11 is configured to include a control electrode disposed on the semiconductor substrate via an insulating film.

The second holding unit 12 holds the electrons transferred from the first holding unit 10 via the second charge transfer unit 11. The third charge transfer unit 13 transfers the electrons held at the second holding unit 12 to the circuit element on the subsequent stage. The third charge transfer unit 13 may be configured to include a control electrode disposed on the semiconductor substrate via the insulating film.

An input node 14 of a amplifier element 15 is configured so as to hold electrons transferred from the second holding unit 12 via the third charge transfer unit 13. The input node 14 of the amplifier element 15 may be configured to include a floating diffusion area (hereinafter, FD area) disposed in the semiconductor substrate. The amplifier element 15 amplifies a signal based on electrons transferred to the input node 14 and outputs to a vertical signal line 20. Here, a MOS transistor (hereinafter, amplifier transistor) is employed as the amplifier element 15. For example, the amplifier transistor makes up a source follower circuit. Also, the third charge transfer unit 13 is disposed in an electrical path between the input node 14 of the amplifier element 15 and the second holding unit 12. That is to say, the input node 14 of the amplifier element 15 and the second holding unit 12 are different nodes. The configuration is not restricted to such an example, and as long as two nodes are configured so as to be electrically insulated, these nodes are different nodes.

A fourth charge transfer unit 7 transfers the electrons of the photoelectric conversion unit 8 to an overflow drain area (hereinafter, OFD area). The OFD area may be configured of an N-type semiconductor region electrically connected to a wiring 16 which supplies power supply voltage, for example. The fourth charge transfer unit 7 may be configured to include a control electrode disposed on the semiconductor substrate via the insulating film. Electronic shutter operation may be performed with the fourth charge transfer unit 7. That is to say, a period to discharge electrons generated at the photoelectric conversion unit 8 (shutter period) and a period to accumulate electrons (exposure period) may be controlled by controlling the fourth charge transfer unit 7.

A reset unit 17 supplies reference voltage to the input node 14 of the amplifier element 15. The reset unit 17 resets the electrons held at the input node 14 of the amplifier element 15. Here, a MOS transistor (hereinafter, reset transistor) is employed as the reset unit 17.

A selecting unit 18 selects each pixel to read out the signal of a pixel to a vertical signal line 20 for each pixel or for every pixel row. Here, a MOS transistor (hereinafter, selecting transistor) is employed as the selecting unit 18. Note that the selecting unit 18 may be disposed in a path between the amplifier element 15 and the vertical signal line 20. Alternatively, the selecting unit 18 may be omitted. With an example of the selecting unit 18 being omitted, a pixel is selected by voltage that the reset unit 17 supplies to the input node 14 of the amplifier element 15.

Predetermined voltage is supplied to the drain of the reset transistor and the drain of the selecting transistor via a wiring 19. The predetermined voltage is power supply voltage, for example. Note that, in the event that the selecting unit 18 has been disposed in a path between the amplifier element 15 and the vertical signal line 20, and also in the event that the selecting unit 18 has been omitted, the drain of the amplifier transistor is connected to the wiring 19.

A reset control wiring 21 supplies a driving pulse PRES to the gate of the reset transistor. A selection control wiring 22 supplies a driving pulse PSEL to the gate of the selecting transistor. A third transfer control wiring 23 supplies a driving pulse PTX3 to a control electrode (hereinafter, third control gate) making up the third charge transfer unit 13. A second transfer control wiring 24 supplies a driving pulse PTX2 to a control electrode (hereinafter, second control gate) making up the second charge transfer unit 11. A first transfer control wiring 25 supplies a driving pulse PTX1 to a control electrode (hereinafter, first control gate) making up the first charge transfer unit 9. A fourth transfer control wiring 26 supplies a driving pulse PTX4 to a control electrode (hereinafter, fourth control gate) making up the fourth charge transfer unit 7. The height of the potential barrier of the semiconductor region below each of the control gates may be changed by changing a pulse value to be supplied to each of the control gates.

With some embodiments, at the pixel configuration illustrated with the equivalent circuit exemplified in FIG. 2, the electrical path between the photoelectric conversion unit 8 and the first holding unit 10 may have the following configuration. The configuration thereof is a configuration wherein the first charge transfer unit 9 disposed in the electrical path between the photoelectric conversion unit 8 and the first holding unit 10 is in a non-conductive state, and electrons are allowed to be moved from the photoelectric conversion unit 8 to the first holding unit 10. Here, the non-conductive state is a state in which of pulse values to be supplied to the first charge transfer unit 9, a pulse value to generate the highest potential barrier has been supplied. Accordingly, the first charge transfer unit 9 does not have to be so-called completely off, and the non-conductive state of the first charge transfer unit 9 also includes a state in which some sort of potential barrier has occurred as compared to a case where the first charge transfer unit 9 has completely been turned on.

For example, in the event that a MOS transistor is the first charge transfer unit 9, a specific configuration may be made by this MOS transistor having an embedded channel configuration. More generally speaking, this configuration is a configuration wherein there is a portion in an area deeper than the surface where the potential barrier for an electrode is lower than the surface when the first charge transfer unit 9 is in a non-conductive state. In this case, a driving pulse to be supplied to the first charge transfer unit 9 may be a fixed value. That is to say, a fixed potential barrier may be employed instead of a configuration wherein two states of an conductive state and a non-conductive state are switchable.

According to such a configuration, when light is input to the photoelectric conversion unit 8, almost of electrons generated by photoelectric conversion are moved to the first holding unit 10 during the exposure period. Accordingly, the accumulation periods of all of the pixels disposed in the image pickup area 2 may be aligned.

Further, when the first charge transfer unit 9 is in a non-conductive state, a hole is accumulated on the surface. Also, the channel where electrons move exists in a predetermined depth portion from the surface, and accordingly, influence of dark current may be reduced as compared to a case where electrons move in an interface between the semiconductor substrate and the insulating film.

Alternatively, the electrical path between the photoelectric conversion unit 8 and the first holding unit 10 may have another configuration. The other configuration is a configuration wherein the first charge transfer unit 9 disposed in the electrical path between the photoelectric conversion unit 8 and the first holding unit 10 is in a non-conductive state, and no electrons are moved from the photoelectric conversion unit 8 to the first holding unit 10. Here, the non-conductive state is a state in which of pulse values to be supplied to the first charge transfer unit 9, a pulse value to generate the highest potential barrier has been supplied. In other words, this is a configuration wherein the majority of electrons generated by photoelectric conversion is accumulated in the photoelectric conversion unit 8.

During a period for accumulating electrons at the photoelectric conversion unit 8, a lower potential barrier than the potential barrier at the first charge transfer unit 9 is formed, and accordingly, a configuration wherein no electrons are moved from the photoelectric conversion unit 8 to the first holding unit 10 may be obtained. As for a specific configuration, when the first charge transfer unit 9 and fourth charge transfer unit 7 are in a non-conductive state, a potential barrier to be formed below the control electrode of the first charge transfer unit 9 is higher than a potential barrier to be formed below the control electrode of the fourth charge transfer unit 7. Note that, when the first charge transfer unit 9 and fourth charge transfer unit 7 are in a non-conductive state, electrons may be accumulated at the photoelectric conversion unit 8.

According to such a configuration, the majority of electrons generated by photoelectric conversion at the time of light being input to the photoelectric conversion unit 8 is accumulated in the photoelectric conversion unit 8 during the exposure period. Accordingly, with all of the pixels disposed in the image pickup area 2, charge accumulated in the photoelectric conversion units 8 is simultaneously transferred to the first holding unit 10, whereby the accumulation periods of all of the pixels may be aligned.

Specific configurations of pixels of some embodiments will be described with reference to FIGS. 3 and 4. Members having the same names as members described in FIG. 2 have the same function, and accordingly, detailed description will be omitted.

Figure 3:
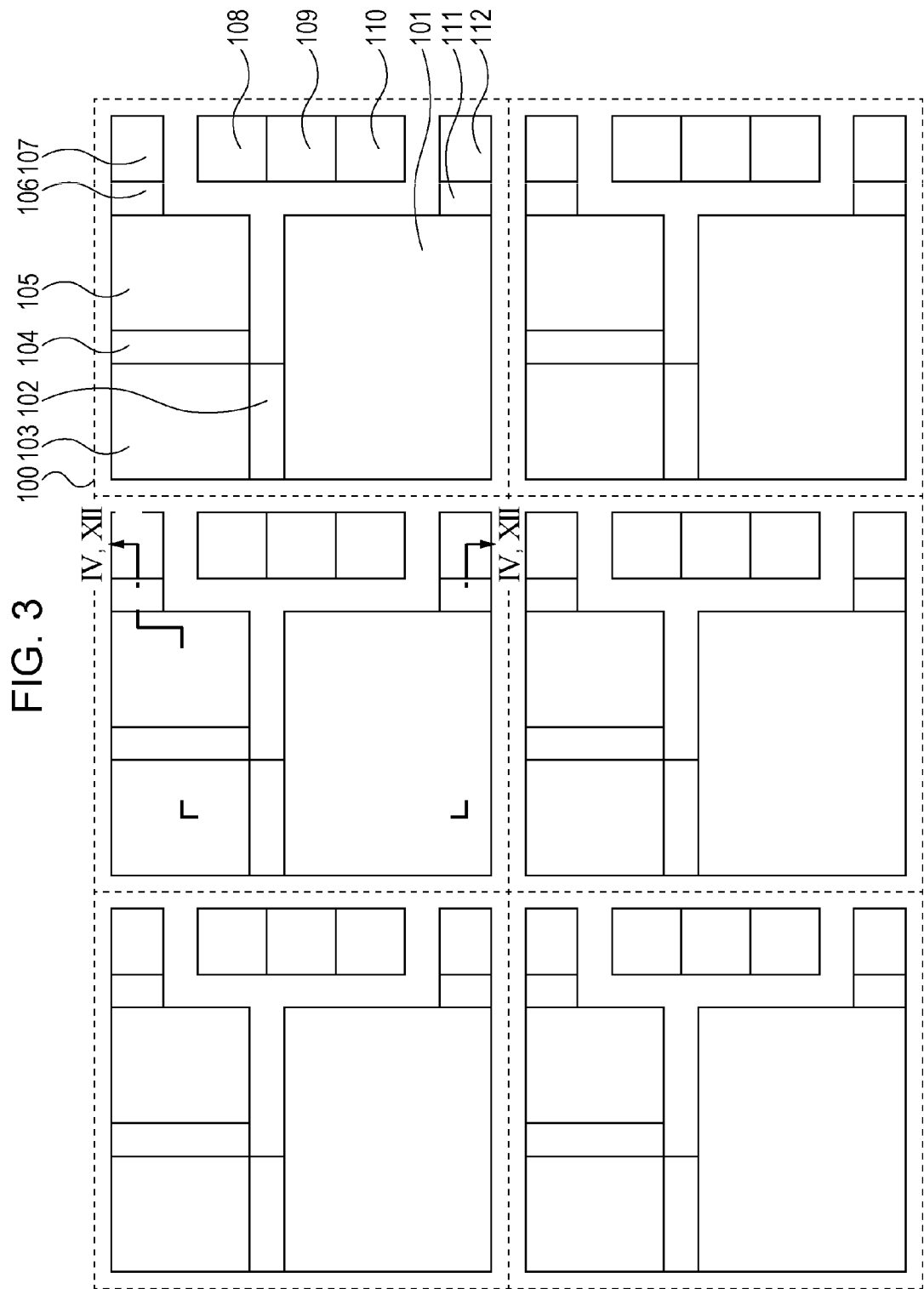
FIG. 3 is a schematic view illustrating the top face of an embodiment of the image pickup apparatus.

FIG. 3 illustrates a top view of image pickup apparatuses according to some embodiments. Here, though six pixels in a total of two rows by three columns are illustrated, an image pickup area may be configured by an even greater number of pixels being disposed.

Pixels 100 are configured of an N-type semiconductor region 101 making up the photoelectric conversion unit 8, a control electrode 102 making up the first charge transfer unit 9, an N-type semiconductor region 103 making up the first holding unit 10, a control electrode 104 making up the second charge transfer unit 11, an N-type semiconductor region 105 making up the second holding unit 12, a control electrode 106 making up the third charge transfer unit 13, an FD area 107, a reset transistor 108, an amplifier transistor 109, and a selecting transistor 110. Further, the pixels 100 include a control electrode 111 and an OFD area 112 which make up the fourth charge transfer unit 7. The FD area 107 is configured to include an N-type semiconductor region where electrons held at the second holding unit 12 are transferred. The OFD area 112 is configured to include an N-type semiconductor region where electrons from the photoelectric conversion unit 8 are transferred.

Note that the OFD area 112 may be shared with the source or drain of the reset transistor, selecting transistor, or amplifier transistor. That is to say, the charge of the first holding unit 10 is transferred to the source or drain of one of the reset transistor, selecting transistor, and amplifier transistor. According to such a configuration, the area of the photoelectric conversion unit 8 may be increased, and accordingly, sensitivity may be improved.

Also, a P-type semiconductor region 115a is disposed below the N-type semiconductor region 103. The N-type semiconductor region 103 and P-type semiconductor region 115a make up a PN junction. A P-type semiconductor region 115b is disposed below the N-type semiconductor region 105. The N-type semiconductor region 105 and P-type semiconductor region 115b make up a PN junction. Note that, with some embodiments, the P-type semiconductor region 115a and 115b may be omitted.

Figure 4:
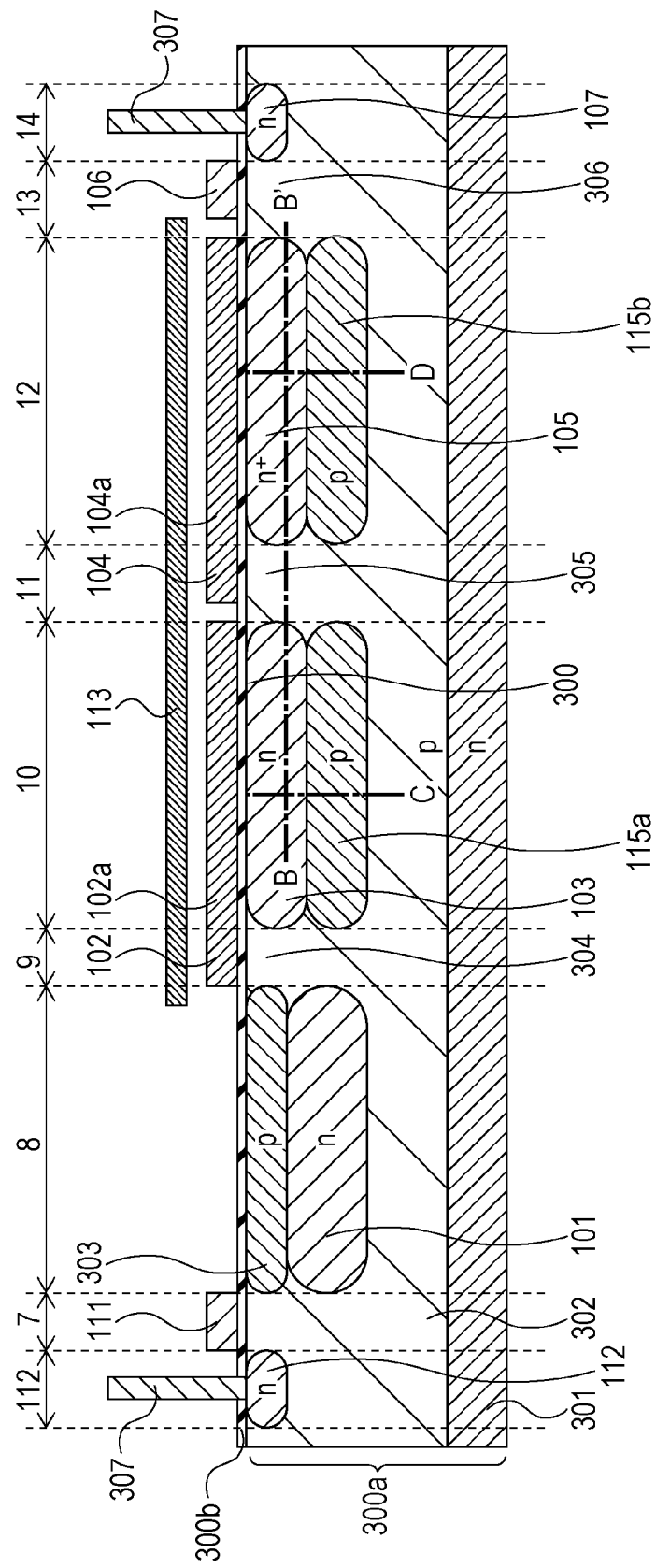
FIG. 4 is a schematic view of the cross section of an embodiment of the image pickup apparatus.

FIG. 4 illustrates a schematic view of a cross-sectional configuration along the line IV-IV in FIG. 3. Members having the same functions in FIG. 2 will be denoted with the same reference numerals, and detailed description will be omitted.

The image pickup apparatuses according to some embodiments include a semiconductor substrate 300a and an insulating film 300b disposed thereon. The semiconductor substrate 300a is silicon, for example. The semiconductor substrate 300a may include a semiconductor region formed with epitaxial growth. The insulating film 300b is a silicon oxide film, for example. A semiconductor region is formed within the semiconductor substrate 300a. Also, a control electrode is disposed on the semiconductor substrate 300a via the insulating film 300b.

An N-type semiconductor region 301 is disposed in the semiconductor substrate 300a. A P-type semiconductor region 302 is disposed on the N-type semiconductor are 301. The N-type semiconductor region 101 is disposed so as to make up a PN junction with the P-type semiconductor region 302. A P-type semiconductor region 303 is disposed on the surface side of the N-type semiconductor region 101, i.e., a side close to the insulating film 300b. A so-called embedded-type photodiode is made up of the P-type semiconductor region 302, N-type semiconductor region 101, and P-type semiconductor region 303.

Electrons generated at the photoelectric conversion unit 8 move in a first channel 304, and reach the N-type semiconductor region 103 which makes up the first holding unit 10. The electrons held at the N-type semiconductor region 103 move in a second channel 305, and reach an N-type semiconductor region 105 which makes up the second holding unit 12. The electrons held at the N-type semiconductor region 105 move in a third channel 306, and reach the N-type semiconductor region 107 which makes up the FD area. Also, electrons generated at the photoelectric conversion unit 8 may be discharged to the OFD area 112 via the fourth charge transfer unit 7.

The control electrode 102 is disposed on the upper portion of the first channel 304 via the insulating film 300b. With some embodiments, the control electrode 102 includes a portion 102a disposed on the N-type semiconductor region 103. The control electrode 102 is shared by the first charge transfer unit 9 and first holding unit 10. That is to say, potential between the photoelectric conversion unit 8 and the first holding unit 10 is controlled by voltage to be applied to the control electrode 102. Additionally, the potential of the first holding unit 10 is controlled by voltage to be applied to the control electrode 102. The first charge transfer unit 9 is configured to include the first channel 304 and a portion of the control electrode 102 disposed on the first channel 304 via the insulating film.

The first holding unit 10 includes the N-type semiconductor region 103 and the P-type semiconductor region 115a which makes up a PN junction with the N-type semiconductor region 103. Electrons are accumulated by the N-type semiconductor region 103 making up PN junction capacitance. Specifically, a depletion layer is formed on the N-type semiconductor region 103 by reverse bias being applied to the N-type semiconductor region 103. Next, electrons are held at the depleted portion of the N-type semiconductor region 103. The entirety of the N-type semiconductor region 103 may be depleted.

Further, the first holding unit 10 is configured to include a portion 102a of the control electrode 102 disposed on the N-type semiconductor region 103 via the insulating film. An inversion layer may be formed on the interface 300 side of the N-type semiconductor region 103 by voltage to be applied to the control electrode 102. Thus, mixing of dark current into the first holding unit 10 may be reduced. Note that, in the event that signal charge is electrons, the first holding unit 10 is configured so as to hold signal charge at an N-type semiconductor region. In the event that signal charge is a positive hole, the first holding unit 10 is configured so as to hold signal charge at a P-type semiconductor region.

The control electrode 104 is disposed on the second channel 305 via the insulating film 300b. With some embodiments, the control electrode 104 includes a portion 104a disposed on the N-type semiconductor region 105. The control electrode 104 is shared by the second charge transfer unit 11 and second holding unit 12. That is to say, potential between the first holding unit 10 and the second holding unit 12 is controlled by voltage to be applied to the control electrode 104. Additionally, the potential of the second holding unit 12 is controlled by voltage to be applied to the control electrode 104. The second charge transfer unit 11 is configured to include the second channel 305 and a portion of the control electrode 104 disposed on the second channel 305 via the insulating film.

The second holding unit 12 includes the N-type semiconductor region 105 and the P-type semiconductor region 115b which makes up a PN junction with the N-type semiconductor region 105. Electrons are accumulated by the N-type semiconductor region 105 making up PN junction capacitance. Specifically, a depletion layer is formed on the N-type semiconductor region 105 by reverse bias being applied to the N-type semiconductor region 105. Next, electrons are held at the depleted portion of the N-type semiconductor region 105. The entirety of the N-type semiconductor region 105 may be depleted.

Further, the second holding unit 12 is configured to include a portion 104a of the control electrode 104 disposed on the N-type semiconductor region 105 via the insulating film. An inversion layer may be formed on the interface 300 side of the N-type semiconductor region 105 by voltage to be applied to the control electrode 104. Thus, mixing of dark current into the second holding unit 12 may be reduced. Note that, in the event that signal charge is electrons, the second holding unit 12 is configured so as to hold signal charge at an N-type semiconductor region. In the event that signal charge is a positive hole, the second holding unit 12 is configured so as to hold signal charge at a P-type semiconductor region.

Predetermined voltage is supplied to a P-type semiconductor region which makes up a PN junction with the N-type semiconductor region 103. Predetermined voltage is supplied to a P-type semiconductor region which makes up a PN junction with the N-type semiconductor region 105. Thus, reverse bias may be applied to the N-type semiconductor regions 103 and 105. The predetermined voltage is ground voltage, for example. With some embodiments, ground voltage is supplied to the P-type semiconductor regions 115a and 115b. Further, ground voltage may be supplied to the P-type semiconductor regions 302 and 303.

The control electrode 106 is disposed on the third channel 306 via the insulating film 300b. The third charge transfer unit 13 is configured to include the third channel 306 and the control electrode 106 disposed on the third channel 306 via the insulating film.

A plug 307 is connected to the FD area 107 and OFD area 112. The FD area 107 is connected to the gate electrode of the amplifier transistor via the plug 307. The OFD area 112 is connected to a wiring 16 which is not illustrated, via the plug 307.

Also, the P-type semiconductor region 115a is disposed below the N-type semiconductor region 103. The P-type semiconductor region 115a may be disposed just below a portion of the N-type semiconductor region 103, or may be disposed below the whole of the N-type semiconductor region 103. The N-type semiconductor region 103 and P-type semiconductor region 115a make up a PN junction. The impurity concentration of the P-type semiconductor region 115a is higher than the impurity concentration of the P-type semiconductor region disposed below the P-type semiconductor region 115a. For example, with some embodiments, the impurity concentration of the P-type semiconductor region 115a is higher than the impurity concentration of the P-type semiconductor region 302. According to such a configuration, extension of the depletion layer from the N-type semiconductor region 103 may be reduced, and accordingly, charge may be transferred from the first holding unit 10 with low voltage.

Also, the P-type semiconductor region 115b is disposed below the N-type semiconductor region 105. The P-type semiconductor region 115b may be disposed below a portion of the N-type semiconductor region 105, or may be disposed just below the whole of the N-type semiconductor region 105. The N-type semiconductor region 105 and P-type semiconductor region 115b make up a PN junction. The impurity concentration of the P-type semiconductor region 115b is higher than the impurity concentration of the P-type semiconductor region disposed below the P-type semiconductor region 115b. For example, with some embodiments, the impurity concentration of the P-type semiconductor region 115b is higher than the impurity concentration of the P-type semiconductor region 302. According to such a configuration, extension of the depletion layer from the N-type semiconductor region 105 may be reduced, and accordingly, charge may be transferred from the second holding unit 12 with low voltage.

Note that either or both of the P-type semiconductor regions 115a and 115b may be omitted. With an example of the P-type semiconductor region 115a being omitted, the P-type semiconductor region 302 disposed below the N-type semiconductor region 103 may have an impurity distribution where the impurity concentration becomes higher the greater the depth is, or an even impurity distribution.

It is desirable that the impurity concentration of the N-type semiconductor region 103 and the impurity concentration of the N-type semiconductor region 105 are each higher than the impurity concentration of the N-type semiconductor region 101. Thus, the charge holding capacitance of the first holding unit 10 and the charge holding capacitance of the second holding unit 12 may be increased. Alternatively, the sensitivity of the photoelectric conversion 8 may be improved.

It is desirable that the impurity concentration of the P-type semiconductor region 303 is higher than that of the P-type semiconductor region 302. Alternatively, it is desirable that the impurity concentration of the P-type semiconductor region 303 is higher than that of the N-type semiconductor region 101. According to such a configuration, noise due to dark current at the photoelectric conversion unit 8 may be reduced.

A light shielding member 113 is disposed above the first holding unit 10 and second holding unit 12. The first holding unit 10 and second holding unit 12 are shielded by the light shielding member 113. Preferably, the light shielding member 113 shields the entire light to be input to the first holding unit 10 and second holding unit 12. The end portion on the photoelectric conversion unit 8 side of the light shielding member 113 is closer to the photoelectric conversion unit 8 than the end portion on the photoelectric conversion unit 8 side of the first holding unit 10. The end portion on the FD area 107 side of the light shielding member 113 is closer to the FD area 107 than the end portion on the FD area 107 side of the second holding unit 12.

However, the configuration is not restricted to this, and as with some embodiments, an arrangement may be made wherein in the event that the control electrode 102 is shared by the first charge transfer unit 9 and first holding unit 10, at least the end portion of the photoelectric conversion unit 8 side of the control electrode 102 is not covered. According to such a configuration, influence of the light shielding member 113 as to the photoelectric conversion unit 8 is reduced, and accordingly, the sensitivity of the photoelectric conversion unit 8 may be improved. Further, influence as to a pixel position of light to be input with a certain angle against the vertical direction may be reduced. Alternatively, electrons subjected to photoelectric conversion at the N-type semiconductor region 103 or P-type semiconductor region 302 which makes up the first holding unit 10 may be accumulated at the N-type semiconductor region 103. Thus, the sensitivity of pixels may be improved.

Note that the overall of the first holding unit 10 does not have to be covered with the light shielding member 113. For example, in order to dispose an electro-conductor for supplying a driving pulse to the control electrode 102 which makes up the first holding unit 10, an opening may be provided to the light shielding member 113.

The overall of the second holding unit 12 does not have to be covered with the light shielding member 113. For example, in order to dispose an electro-conductor for supplying a driving pulse to the control electrode 104 which makes up the second holding unit 12, an opening may be provided to the light shielding member 113.

Metal making up a wiring layer may be employed as the light shielding member 113. Alternatively, there may be employed metal making up a plug for electrically connecting different wiring layers or between a wiring and a semiconductor region. It is desirable to dispose the light shielding member 113 in a place as close as possible to the semiconductor substrate 300a. It is desirable to employ metal making up a wiring layer disposed closest to the semiconductor substrate 300a of the multiple wiring layers, or a metal plug which electrically connects the wiring layer of the lowest layer and a semiconductor region. Alternatively, a metal specifically for the light shielding member 113 may be disposed between the wiring layer of the lowest layer and the semiconductor substrate.

FIG. 4 illustrates the light shielding member 113 alone disposed on the first holding unit 10. However, a light shielding member may be disposed on a transistor making up another pixel circuit. Alternatively, a transistor making up another pixel circuit may be shielded by wiring. Transistors making up another pixel circuit include the above-mentioned rest transistor, selecting transistor, amplifier transistor, and so forth.

Figure 5:
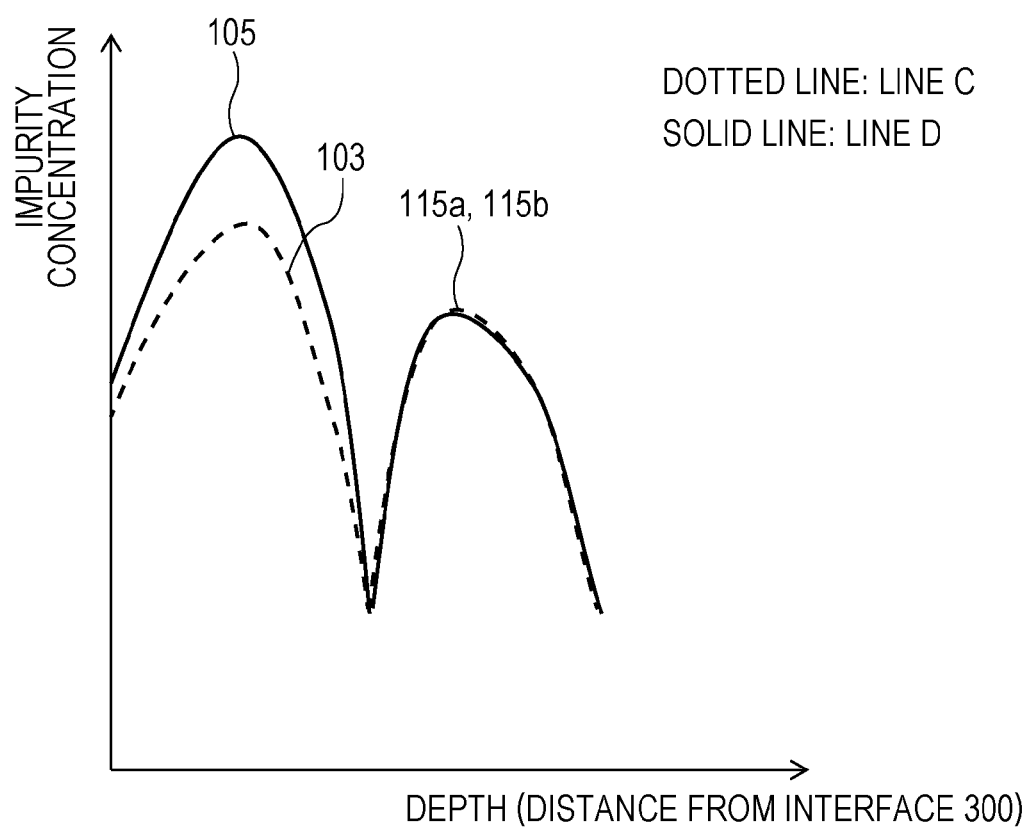
FIG. 5 is a schematic diagram illustrating an impurity concentration distribution of an embodiment of the image pickup apparatus.

Next, the impurity concentration of the first holding unit 10 and second holding unit 12 according to some embodiments will be described. FIG. 5 illustrates an impurity concentration distribution along the line C and line D in FIG. 4. A dotted line indicates an impurity concentration distribution along the line C. A solid line indicates an impurity concentration distribution along the line D. The vertical axis indicates impurity concentration, and the horizontal axis indicates depth from the interface 300.

As illustrated in FIG. 5, with the first holding unit 10, a shallow position, i.e., N-type impurities are distributed near the interface 300, and P-type impurities are distributed a deep position. Examples of the N-type impurities include phosphorus and arsenic. The N-type semiconductor region 103 is made up of the N-type impurities. Also, examples of the P-type impurities include boron. The P-type semiconductor region 115a is made up of the P-type impurities.

With the second holding unit 12 as well, N-type impurities are distributed in a shallow position, and P-type impurities are distributed in a deep position. The N-type semiconductor region 105 is made up of the N-type impurities. Also, the P-type semiconductor region 115b is made up of the P-type impurities.

As illustrate in FIG. 5, impurity concentration at a peak of the impurity distribution of the N-type semiconductor region 103 is lower than impurity concentration at a peak of the impurity distribution of the N-type semiconductor region 105. That is to say, the impurity concentration of the N-type semiconductor region 103 is lower than the impurity concentration of the N-type semiconductor region 105.

Note that, instead of comparing the impurity concentration of the peaks of the impurity distributions, impurity concentration at the same depth may be compared. For example, with some embodiments, at depth indicated with line B-B', the impurity concentration of the N-type semiconductor region 103 is lower than the impurity concentration of the N-type semiconductor region 105 at the same depth.

Next, a driving method according to some embodiments will be described. FIG. 6 illustrates a driving pulse diagram of the image pickup apparatus according to some embodiments. This is a pulse diagram illustrating a case of performing global electronic shutter operation wherein exposure periods agree regarding all of the pixels disposed in the image pickup area 2. Numbers in parentheses indicate the number of rows, and in the present drawing, driving pulses to be supplied to the pixels in the first and second rows are illustrated. PSEL indicates a driving pulse to be supplied to the gate of the selecting transistor. PRES indicates a driving pulse to be supplied to the gate of the reset transistor. PTX1 indicates a driving pulse to be supplied to the first control gate. PTX2 indicates a driving pulse to be supplied to the second control gate. PTX3 indicates a driving pulse to be supplied to the third control gate. PTX4 indicates a driving pulse to be supplied to the fourth control gate. PTS indicates a driving pulse for performing sample hold of a light signal using, for example, the memory unit disposed in the column circuit. PTN indicates a driving pulse for performing sample hold of a noise signal using, for example, the memory unit disposed in the column circuits. All of the driving pulses are in a high level at the time of an conductive state.

At point-in-time t1 and theretofore, the PRES and PTX4 in all of the rows in the image pickup area 2 are in a high level. Here, all other pulses illustrated in FIG. 6 are in a low level. Thus, electrons generated at the photoelectric conversion unit 8 are discharged to the OFD area.

At the point-in-time t1, in a state in which the PRES and PTX4 maintain a high level, with all of the pixels disposed in the image pickup area 2, the PTX1, PTX2, and PTX3 make the transition from a low level to a high level. Thus, the photoelectric conversion unit 8, first holding unit 10, and second holding unit 12 are reset.

At point-in-time t2, the PTX1, PTX2, PTX3, and PTX4 in all of the rows in the image pickup area 2 make the transition from a high level to a low level. According to this operation, exposure periods in all of the pixels disposed in the image pickup area 2 are started. During exposure periods, of electrons generated at the photoelectric conversion unit 8, predetermined amount of electrons move to the first holding unit 10.

After elapsing of a predetermined period following the point-in-time t2, at point-in-time t3 the PTX1 in all of the rows in the image pickup area 2 makes the transition from a low level to a high level, at point-in-time t4 the PTX1 in all of the rows in the image pickup area 2 makes the transition from a high level to a low level. According to this operation, the electrons remaining in the photoelectric conversion unit 8 are transferred to the first holding unit 10. According to this operation, the exposure periods are ended.

At point-in-time t5, the PTX4 in all of the rows disposed in the image pickup apparatus make the transition from a low level to a high level. According to this operation, the height of a potential barrier between the photoelectric conversion unit 8 and OFD area 112 becomes lower than the height of a potential barrier between the photoelectric conversion unit 8 and the first holding unit 10. Thus, electrons generated at the photoelectric conversion unit 8 do not move to the first holding unit 10 but move to the OFD area 112.

Further, at the point-in-time t5, the PTX2 in all of the rows disposed in the image pickup area 2 make the transition from a low level to a high level, and at point-in-time t6 the PTX2 in all of the rows disposed in the image pickup area 2 make the transition from a high level to a low level. According to this operation, electrons held at the first holding units 10 are transferred to the second holding unit 12.

At point-in-time t7, the PSEL(1) makes the transition from a low level to a high level. According to this operation, the signals of the pixels at the first row are placed in a state enabled to be output to the vertical signal line 20. Further, at the point-in-time t7, the PRES(1) makes the transition from a high level to a low level. Thus, the reset operations of the input nodes 14 of the amplifier elements 15 are completed.

At point-in-time t8, the PTN makes the transition from a low level to a high level, and point-in-time t9 the PTN makes the transition from a high level to a low level. According to this operation, a noise signal is held at, for example, the memory unit for noise signals disposed in the column circuit.

At point-in-time t10, the PTX3(1) makes the transition from a low level to a high level, and at point-in-time t11 the PTX3(1) makes the transition from a high level to a low level. According to this operation, electrons held at the second holding units 12 of the pixels at the first row are transferred to the input nodes 14 of the amplifier elements 15.

At point-in-time t12, the PTS makes the transition from a low level to a high level, and at point-in-time t13 the PTS makes the transition from a high level to a low level. According to this operation, a light signal on which a noise signal is superimposed is held at, for example, the memory unit for light signals disposed in the column circuit.

At point-in-time t14, the PSEL(1) makes the transition from a high level to a low level. According to this operation, the readout periods of the signals of the pixels at the first row are ended. The readout periods of the pixels at the first row are a period from the point-in-time t7 to the point-in-time t14. Further, at the point-in-time t14, the PRES(1) makes the transition from a low level to a high level. Thus, reset for the input nodes 14 of the amplifier elements 15 of the pixels of the first row is started.

After this, with a period from point-in-time t15 to point-in-time t22, readout of the signals of the pixels at the second row are performed. This operation is the same operation as the first row, and accordingly, detailed description will be omitted. The operation at each point-in-time from the point-in-time t15 to the point-in-time t22 is the same as the operation at each point-in-time from the point-in-time t7 to the point-in-time t14 except that objects for driving pulses to be set to a high level belong to the second row.

According to such an operation, the exposure periods may be equalized regarding all of the pixels disposed in the image pickup area 2. With this operation, up to transfer to the second holding unit 12 is performed at the entire image pickup surface at the same time. The specific point-in-time thereof is the point-in-time t6. Thereafter, readout of all of the rows in the image pickup area 2 is performed by repeating the readout operation.

FIGS. 7A to 7D and 8A to 8E illustrate a relation of height of a potential barrier at each point-in-time and period in the driving pulse diagram illustrated in FIG. 6. FIGS. 7A to 7D and 8A to 8E illustrate the potentials of the OFD area 112, fourth charge transfer unit 7, photoelectric conversion unit 8, first charge transfer unit 9, first holding unit 10, second charge transfer unit 11, second holding unit 12, third charge transfer unit 13, and input node 14 (FD area 107). The potential of a pixel according to some embodiments is illustrated with a solid line.

Note that, with the present Specification, the potential is the potential energy of signal charge. For example, in the event that signal charge is electrons, the higher the voltage applied to a control electrode is, the lower the potential of the semiconductor region below the control electrode becomes. This is because electrons have negative charge. At an area where voltage is high, the potential energy of electrons is low. On the other hand, in the event that signal charge is a hole, the higher the voltage applied to a control electrode is, the higher the potential of the semiconductor region below the control electrode becomes. This is because holes have positive charge. At an area where voltage is high, the potential energy of a hole is high. In FIGS. 7A to 7D and 8A to 8E, the lower portions in the drawings represent low potential for signal charge, and the upper portions in the drawings represent high potential for signal charge.

FIG. 7A is a diagram illustrating a potential state during a period from the point-in-time t1 to the point-in-time t2. As described in FIG. 6, with the period from the point-in-time t1 to the point-in-time t2, a pulse in a high level is supplied to all of the first charge transfer unit 9, second charge transfer unit 11, third charge transfer unit 13, and fourth charge transfer unit 7. That is to say, potential barriers generated at all of the charge transfer units are in a low state. Electrons generated at the photoelectric conversion unit 8 are discharged to the OFD area 112 or the drain (not illustrated) of the reset transistor. It is desirable that there are no electrons in the photoelectric conversion unit 8, first holding unit 10, and second holding unit 12.

As for a preferable potential state as to electrons at this time, the photoelectric conversion unit 8 exhibits the highest potential. Further, as illustrated in the drawings, it is a preferable state in which potential sequentially decreases from the photoelectric conversion unit 8 to the input node 14 of the amplifier element 15. That is to say, the potential of the photoelectric conversion unit 8 may be higher than the potential of the first holding unit 10. The potential of the first holding unit 10 may be higher than the potential of the second holding unit 12. The potential of the second holding unit 12 may be higher than the potential of the input node 14.

Figure 7C:
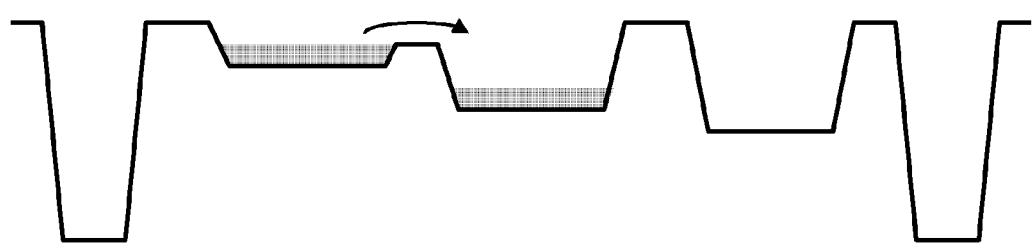

FIGS. 7B and 7C are diagrams illustrating a potential state of a period from the point-in-time t2 to the point-in-time t3, i.e., during the exposure period. The first charge transfer unit 9 is in a non-conductive state. Specifically, as compared to the case in FIG. 7A, the height of a potential barrier between the photoelectric conversion unit 8 and the first holding unit 10 is higher. Further, the fourth charge transfer unit 7 is in a non-conductive state. Specifically, as compared to the case in FIG. 7A, the height of a potential barrier between the photoelectric conversion unit 8 and the OFD area 112 is higher. Thus, in FIG. 7B, small amount of electrons is accumulated at the photoelectric conversion unit 8. Also, in the state in FIG. 7B, the height of a potential barrier to be generated at the first charge transfer unit 9 is lower than the height of a potential barrier to be generated at the fourth charge transfer unit 7.

The potential state in FIG. 7C is the same as with FIG. 7B, but the amount of light input to the photoelectric conversion unit 8 differs. In the event that a certain amount or more of electrons have been generated at the photoelectric conversion unit 8, the electrons cross over the potential barrier generated at the first charge transfer unit 9 and move to the first holding unit 10. That is to say, in the event of predetermined amount or more of light being input, the photoelectric conversion unit 8 and first holding unit 10 hold the electrons during the exposure period.

With some embodiments, as illustrated in FIG. 7B, when the first charge transfer unit 9, second charge transfer unit 11, and third charge transfer unit 13 are in a non-conductive state, i.e., in a state in which the potential of each of the channels is high, the potential of the first holding unit 10 is higher than the potential of the second holding unit 12. In the event that the impurity concentration of the N-type semiconductor region 103 which makes up the first holding unit 10 is lower than the impurity concentration of the N-type semiconductor region 105 which makes up the second holding unit 12, such a potential state may readily be obtained. This is because when all of the N-type semiconductor regions 103 and 105 are depleted, great reverse bias is allowed to be applied by the N-type semiconductor region 105 having higher impurity concentration.

Figure 7D:
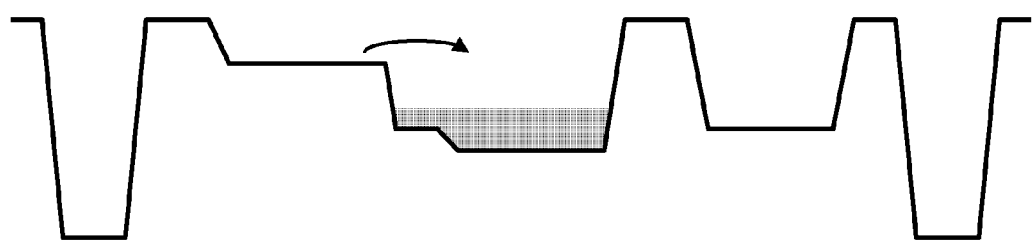

FIG. 7D is a diagram illustrating a potential state during a period from the point-in-time t3 to the point-in-time t4. The electrons accumulated at the photoelectric conversion unit 8 are transferred to the first holding unit 10. In order to improve transfer efficiency of the electrons from the photoelectric conversion unit 8, it is desirable that a potential barrier at the time of electro-conduction of the first charge transfer unit 9 is lower than the potential of the photoelectric conversion unit 8. Further, it is desirable that the potential of the first holding unit 10 is lower than the potential of the photoelectric conversion unit 8.

With some embodiments, the control electrode 102 is shared by the first charge transfer unit 9 and first holding unit 10, and accordingly, in the event of a driving pulse which causes the first charge transfer unit 9 to be an conductive state being supplied, the potential of the first holding unit 10 also becomes low. Thus, as illustrated in FIG. 7D, potential when there are no electrons at the first holding unit 10 may be lower than the potential of the second holding unit 12.

Figure 8A:
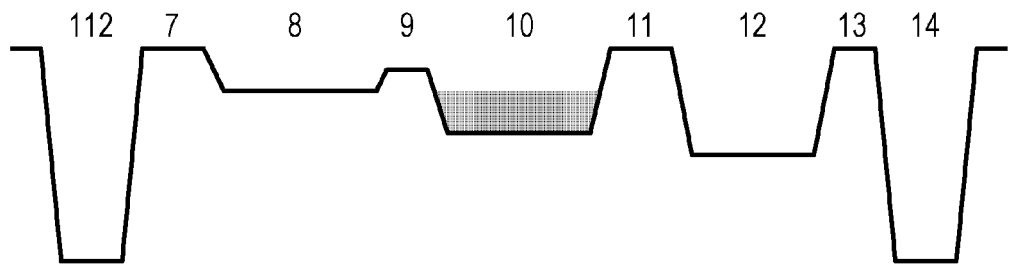
FIGS. 8A to 8E are schematic diagrams representing potential of an embodiment of the image pickup apparatus.

FIG. 8A is a diagram illustrating a potential state during a period from the point-in-time t4 to the point-in-time t5. This illustrates a state in which the first charge transfer unit 9 is placed in a non-conductive state, and also, the second charge transfer unit 11 is in a state before entering the conductive state. The amount of electrons determined by the potential barrier generated at the first charge transfer unit 9 is accumulated in the first holding unit 10.

Figure 8B:
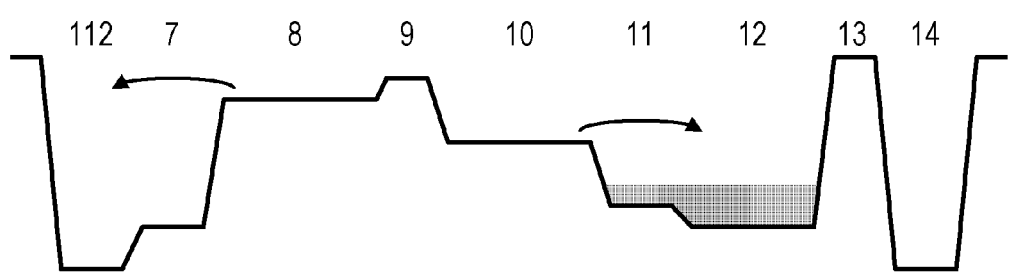

FIG. 8B is a diagram illustrating potential states from the point-in-time t5 to the point-in-time t6. The fourth charge transfer unit 7 is in an conductive state, and accordingly, the potential barrier at the fourth charge transfer unit 7 becomes lower than the potential barrier at the first charge transfer unit 9. It is desirable that the potential barrier at the fourth charge transfer unit 7 is lower than the potential of the photoelectric conversion unit 8. According to such a potential state, electrons generated at the photoelectric conversion unit 8 may be moved to the OFD area 112 while holding electrons at the first holding unit 10.

Also, in FIG. 8B, the second charge transfer unit 11 is in an conductive state. Thus, the electrons held at the first holding unit 10 are transferred to the second holding unit 12 via the second charge transfer unit 11. In order to improve transfer efficiency of the electrons from the first holding unit 10, it is desirable that the height of the potential barrier at the time of electro-conduction of the second charge transfer unit 11 is lower than the potential of the first holding unit 10. Further, it is desirable that the potential of the second holding unit 12 is lower than the potential of the first holding unit 10. With some embodiments, the control electrode 104 is shared by the second charge transfer unit 11 and second holding unit 12, and accordingly, the potential of the second holding unit 12 also decreases when a driving pulse which causes the second charge transfer unit 11 to be an conductive state is supplied.

With some embodiments, in the event that the first charge transfer unit 9, second charge transfer unit 11, and third charge transfer unit 13 are in a non-conductive state, the potential of the first holding unit 10 is higher than the potential of the second holding unit 12, and accordingly, the potential state illustrated in FIG. 8B is readily be formed. For example, the potential state in FIG. 8B may be formed with low voltage.

Figure 8C:
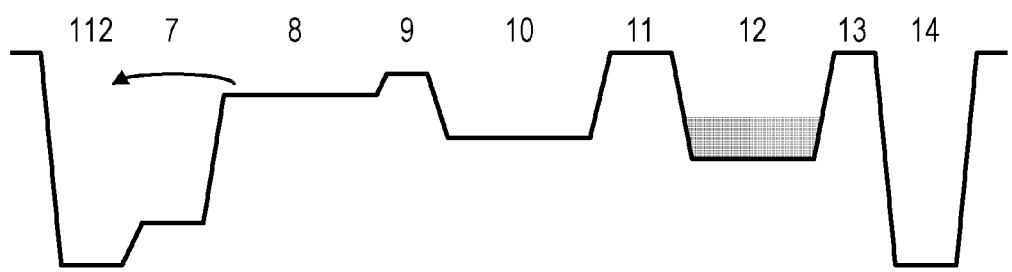

FIG. 8C illustrates potential states of the pixels at the first row during a period from the point-in-time t6 to the point-in-time t10, and potential states of the pixels at the second row during a period from the point-in-time t6 to the point-in-time t18. This is a period after the second charge transfer unit 11 is placed in an conductive state, up to the third charge transfer unit 13 conducting. The length of this period may differ for each pixel row. The second charge transfer unit 11 and the third charge transfer unit 13 are both in a non-conductive state, with electrons being accumulated in the second holding unit 12 due to these potential barriers.

Figure 8D:
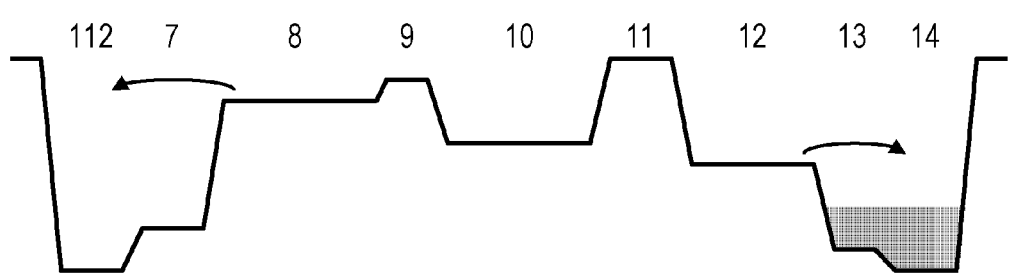

FIG. 8D illustrates a potential state of pixels in the first row from point-in-time t10 to point-in-time t11, and a potential state of pixels in the second row from point-in-time t18 to point-in-time t19. The third charge transfer unit 13 is placed in an conductive state. Thus, the electrons held at the second holding unit 12 are transferred to the input node 14 of the amplifier element 15. In order to improve transfer efficiency of the electrons from the second holding unit 12, it is desirable that the height of the potential barrier at the time of electro-conduction of the third charge transfer unit 13 is lower than the potential height of the second holding unit 12. Further, it is desirable that the potential height of the input node 14 of the amplifier element 15 is lower than the potential height of the second holding unit 12. Note that the disclosure is not restricted to such a potential relation. A heretofore known configuration may be employed for transfer of electrons from the second holding unit 12 to the input node 15 of the amplifier element 15. In particular, in the event that the input node 14 of the amplifier element 14 is configured to include the FD area 107 connected to an electro-conductor, the potential of the input node 14 of the amplifier element 15 may be set optionally according to voltage to be applied to this electro-conductor.

Figure 8E:
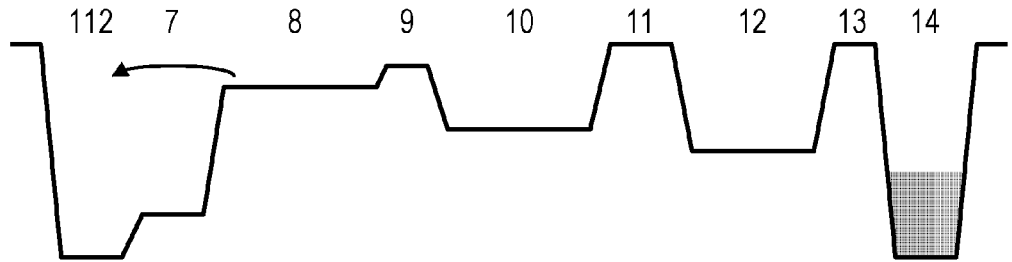

FIG. 8E is a diagram representing potential states of the pixels at the first row during a period from the point-in-time t11 to the point-in-time t14, and potential states of the pixels at the second row during a period from the point-in-time t19 to the point-in-time t22. This is a diagram illustrating potential states after the third charge transfer unit 13 is placed in a non-conductive state. While light is input to the photoelectric conversion unit 8, electrons are discharged to the OFD area by the fourth charge transfer unit 7. Also, electrons may also be mixed into the first holding unit 10. However, the height of the potential barrier of the second charge transfer unit 11 is higher than the height of the potential barrier of the first charge transfer unit 9, and accordingly, a charge is not readily mixed into the second holding unit 12. The potentials of the pixels at the first row at the point-in-time t14 and thereafter, and the potentials of the pixels at the second row at the point-in-time t22 and thereafter may be in a state illustrated in FIG. 7A.

Next, another driving method according to some embodiments will be described. With the other driving method, the second charge transfer unit 11 is changed to be in an conductive state between the point-in-time t2 and the point-in-time t3 in FIG. 6. A specific operation will be described along with potential states of the pixels.

FIGS. 9A to 9D are diagrams illustrating potential states of pixels according to some embodiments. FIGS. 9A to 9D illustrate the potentials of the OFD area 112, fourth charge transfer unit 7, photoelectric conversion unit 8, first charge transfer unit 9, first holding unit 10, second charge transfer unit 11, second holding unit 12, third charge transfer unit 13, and input node 14 (FD area 107).

Figure 9A:
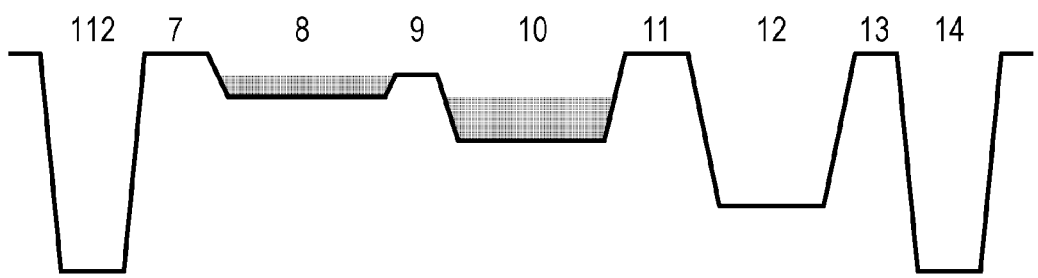
FIGS. 9A to 9D are schematic diagrams representing potential of an embodiment of the image pickup apparatus.

FIG. 9A illustrates the same potential state as with FIG. 7C. Specifically, this illustrates a state in which electrons generated by photoelectric conversion are held at the photoelectric conversion unit 8 and first holding unit 10 during the exposure period.

Figure 9B:
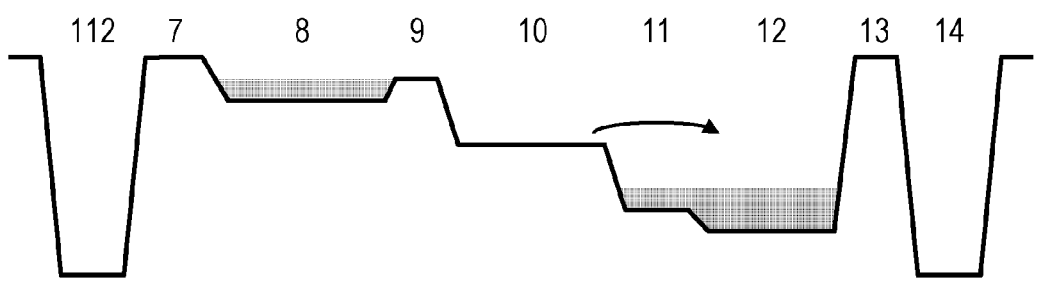

Here, as illustrated in FIG. 9B, the second charge transfer unit 11 is changed to be in an conductive state during the exposure period. Specifically, the potential of the second charge transfer unit 11 becomes lower than the potential of the first holding unit 10. Thus, electrons at the photoelectric conversion unit 8 or first holding unit 10 may move to the second holding unit 12. That is to say, electrons generated during the exposure period are held at the second holding unit 12.

Figure 9C:
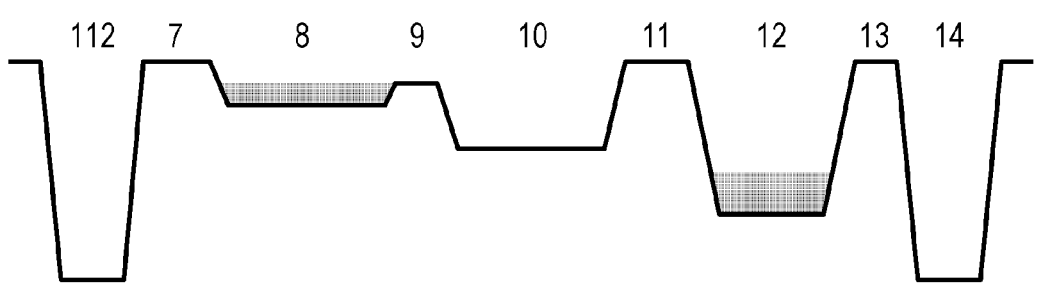
Figure 9D:
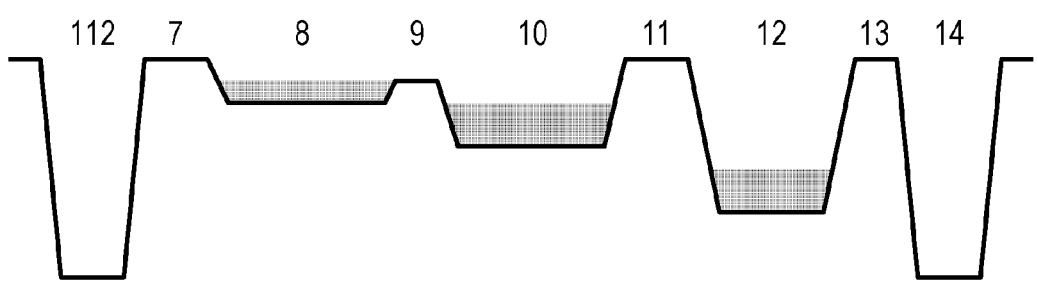

Thereafter, as illustrated in FIG. 9C, the second charge transfer unit 11 is changed to be in a non-conductive state. As illustrated in FIG. 9D, electrons generated after the second charge transfer unit 11 is placed in a non-conductive state may move to the first holding unit 10.

According to such a driving method, electrons generated during an exposure period are held at the photoelectric conversion unit 8, first holding unit 10, and second holding unit 12. Consequently, saturation charge amount may be improved.

Note that an operation after FIG. 9D is the same as the operation in FIG. 7D and thereafter. Also, the operation in FIGS. 9B and 9C may be repeated twice or more.

Figure 10:
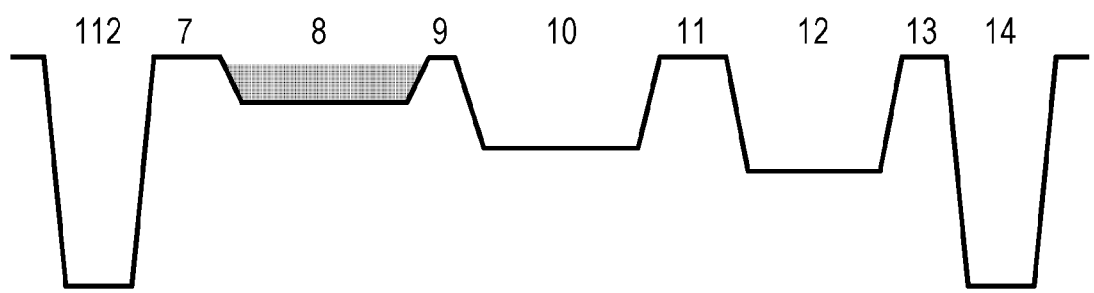
FIG. 10 is a schematic diagram representing potential of an embodiment of the image pickup apparatus.

Next, another example of a potential state in the pixels according to some embodiments will be described. FIG. 10 is a diagram illustrating potential states of the pixels according to some embodiments. FIG. 10 illustrates the potentials of the OFD area 112, fourth charge transfer unit 7, photoelectric conversion unit 8, first charge transfer unit 9, first holding unit 10, second charge transfer unit 11, second holding unit 12, third charge transfer unit 13, and input node 14 (FD area 107).

AS illustrated in FIG. 10, the potential of the first charge transfer unit 9 is equal to the potential of the fourth charge transfer unit 7. Thus, electrons generated during an exposure period are accumulated in the photoelectric conversion unit 8, and do not move to the first holding unit 10. Note that the potential of the first charge transfer unit 9 may be higher than the potential of the fourth charge transfer unit 7. In this case, electrons overflowing from the photoelectric conversion unit 8 readily moves to the OFD area 112, and accordingly, noise may be reduced.

With some embodiments, the same voltage is supplied to the control electrode for changing each of the charge transfer units to be in a non-conductive state. The voltage to be supplied is not restricted to this, different voltage may be supplied to the control electrode for changing each of the charge transfer units to be in a non-conductive state. Also, with some embodiments, the control electrodes of the first charge transfer unit 9 and second charge transfer unit 11 are shared as the control electrodes of the first holding unit 10 and second holding unit 12, respectively. Therefore, the same voltage is supplied to the control electrode of the first holding unit 10 and the control electrode of the second holding unit 12.

With some embodiments, when any of the first charge transfer unit 9, second charge transfer unit 11, and third charge transfer unit 13 is in a non-conductive state, the potential of the first holding unit 10 is higher than the potential of the second holding unit 12. According to such a configuration, transfer of charge from the first holding unit 10 to the second holding unit 12 may effectively be performed.

Also, with some embodiments, the impurity concentration of the N-type semiconductor region 103 is lower than the impurity concentration of the N-type semiconductor region 105. According to such a configuration, increasing the potential of the first holding unit 10 as compared to the potential of the second holding unit 12 is facilitated.

Also, with some embodiments, the impurity concentration of the N-type semiconductor region 105 may be increased. According to such a configuration, the amount of charge per unit area to be held by the second holding unit 12 may be increased. Thus, the area of the second holding unit 12 may be reduced while improving saturation charge amount. Therefore, the area occupied by the photoelectric conversion unit 8 may be increased. Also, light shielding is facilitated by the area of the second holding unit 12 being small. The second holding unit 12 holds charge during a shutter period, and accordingly, noise may be reduced by improving light shielding performance.

Second Embodiment

An embodiment of the image pickup apparatus will be described. The present embodiment is differs from the first embodiment in that the fourth charge transfer unit 7 is configured so as to discharge the charge of the first holding unit 10. The other configurations are all the same as with the first embodiment. Accordingly, points alone different from the first embodiment will be described, and description will be omitted regarding the other portions.

The overall block configuration of the image pickup apparatus according to the present embodiment is the same as with the first embodiment. Specifically, FIG. 1 is an overall block diagram of the image pickup apparatus according to the present embodiment.

Figure 11:
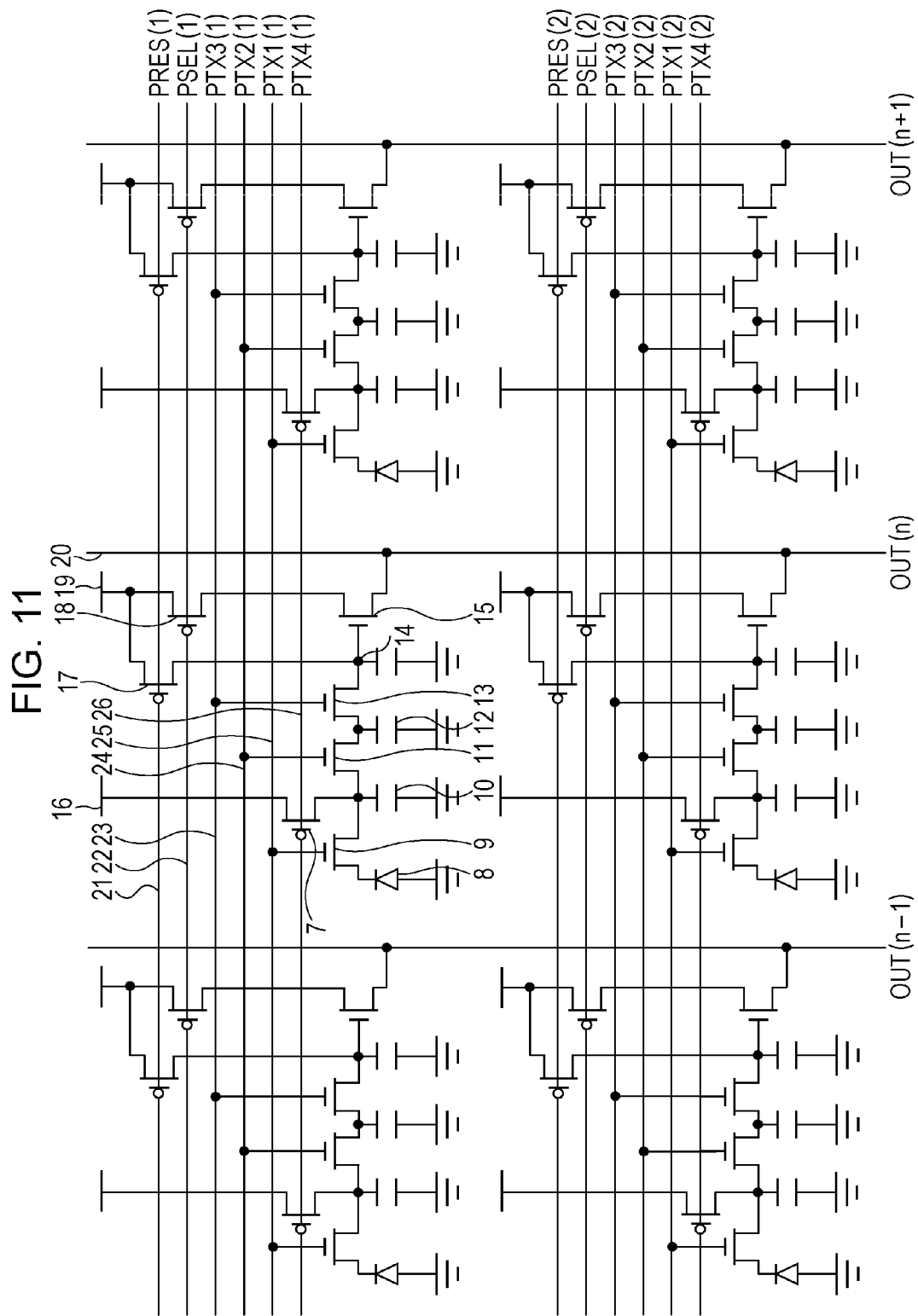
FIG. 11 is a diagram illustrating an equivalent circuit of an embodiment of the image pickup apparatus.

FIG. 11 illustrates an equivalent circuit of image pickup apparatuses according to some embodiments. Here, though six pixels in a total of two rows by three columns are illustrated, an image pickup area may be configured by an even greater number of pixels being disposed. Portions having the same functions as with FIG. 2 are denoted with the same reference numerals. Detailed description regarding the same portions as with FIG. 2 will be omitted.

With some embodiments, the fourth charge transfer unit 7 transfers the electrons of the first holding unit 10 to an overflow drain area (hereinafter, OFD area). The OFD area is a charge discharging node from which charge is discharged. The OFD area may be configured of a N-type semiconductor region electrically connected to the wiring 16 which supplies power supply voltage, for example. The fourth charge transfer unit 7 may be configured to include a control electrode disposed on the semiconductor substrate via the insulating film. Discharging of the charge held at the first holding unit 10 may be controlled by voltage to be supplied to the control electrode of the fourth charge transfer unit 7.

With some embodiments, electronic shutter operation may be performed by the first charge transfer unit 9 and fourth charge transfer unit 7. That is to say, a period to discharge electrons generated at the photoelectric conversion unit 8 (shutter period) and a period to accumulate electrons (exposure period) may be controlled by controlling the first charge transfer unit 9 and fourth charge transfer unit 7.

A reset control wiring 21 supplies a driving pulse PRES to the gate of the reset transistor. A selection control wiring 22 supplies a driving pulse PSEL to the gate of the selecting transistor. The third transfer control wiring 23 supplies a driving pulse PTX3 to a control electrode (hereinafter, third control gate) making up the third charge transfer unit 13. A second transfer control wiring 24 supplies a driving pulse PTX2 to a control electrode (hereinafter, second control gate) making up the second charge transfer unit 11. A first transfer control wiring 25 supplies a driving pulse PTX1 to a control electrode (hereinafter, first control gate) making up the first charge transfer unit 9. A fourth transfer control wiring 26 supplies a driving pulse PTX4 to a control electrode (hereinafter, fourth control gate) making up the fourth charge transfer unit 7. The height of the potential barrier of the semiconductor region below each of the control gates may be changed by changing a pulse value to be supplied to each of the control gates. That is to say, the charge transfer units and charge discharge units may control potential of a charge transfer path disposed beneath a control electrode.

With some embodiments, at the pixel configuration illustrated with the equivalent circuit exemplified in FIG. 2, the electrical path between the photoelectric conversion unit 8 and the first holding unit 10 may have the following configuration. The configuration thereof is a configuration wherein the first charge transfer unit 9 disposed in the electrical path between the photoelectric conversion unit 8 and the first holding unit 10 is in a non-conductive state, and electrons are allowed to be moved from the photoelectric conversion unit 8 to the first holding unit 10. Here, the non-conductive state is a state in which of pulse values to be supplied to the first charge transfer unit 9, a pulse value to generate the highest potential barrier has been supplied. Accordingly, the first charge transfer unit 9 does not have to be so-called completely off, and the non-conductive state of the first charge transfer unit 9 also includes a state in which some sort of potential barrier has occurred as compared to a case where the first charge transfer unit 9 has completely been turned on.

For example, in the event that a MOS transistor is the first charge transfer unit 9, a specific configuration may be made by this MOS transistor having an embedded channel configuration. More generally speaking, this configuration is a configuration wherein there is a portion in an area deeper than the surface where the potential barrier for electrons is lower than the surface when the first charge transfer unit 9 is in a non-conductive state. In this case, a driving pulse to be supplied to the first charge transfer unit 9 may be a fixed value. That is to say, a fixed potential barrier may be employed instead of a configuration wherein two states of an conductive state and a non-conductive state are switchable.

According to such a configuration, when light is input to the photoelectric conversion unit 8, almost of electrons generated by photoelectric conversion are moved to the first holding unit 10 during the exposure period. Accordingly, the accumulation periods of all of the pixels disposed in the image pickup area 2 may be aligned by performing transfer of charge from the first holding unit 10 to the second holding unit 12 in parallel.

Further, when the first charge transfer unit 9 is in a non-conductive state, a hole is accumulated on the surface. Also, the channel where electrons move exists in a predetermined depth portion from the surface, and accordingly, influence of dark current may be reduced as compared to a case where electrons move in an interface between the semiconductor substrate and the insulating film.

Alternatively, the electrical path between the photoelectric conversion unit 8 and the first holding unit 10 may have another configuration. The other configuration is a configuration wherein the first charge transfer unit 9 disposed in the electrical path between the photoelectric conversion unit 8 and the first holding unit 10 is in a non-conductive state, and no electrons are moved from the photoelectric conversion unit 8 to the first holding unit 10. Here, the non-conductive state is a state in which of pulse values to be supplied to the first charge transfer unit 9, a pulse value to generate the highest potential barrier has been supplied. In other words, this is a configuration wherein the majority of electrons generated by photoelectric conversion is accumulated in the photoelectric conversion unit 8.

During a period for accumulating electrons at the photoelectric conversion unit 8, a lower potential barrier than the potential barrier at the first charge transfer unit 9 is formed around the photoelectric conversion unit 8, and accordingly, a configuration wherein no electrons are moved from the photoelectric conversion unit 8 to the first holding unit 10 may be obtained. As for a specific configuration, when the first charge transfer unit 9 is in a non-conductive state, a potential barrier to be formed below the first control electrode is higher than a potential barrier to be formed between the photoelectric conversion unit 8 and another circuit element. The other circuit element is, for example, the OFD area of the fourth charge transfer unit 7. Or, the other circuit element is the reset transistor, selecting transistor, amplifier transistor, or the like.

According to such a configuration, the majority of electrons generated by photoelectric conversion at the time of light being input to the photoelectric conversion unit 8 is accumulated in the photoelectric conversion unit 8 during the exposure period. Accordingly, with all of the pixels disposed in the image pickup area 2, charge accumulated in the photoelectric conversion units 8 is simultaneously transferred to the first holding unit 10, whereby the accumulation periods of all of the pixels may be aligned.

A specific configuration of pixels according to some embodiments is the same as with the first embodiment. Specifically, FIGS. 3 and 4 illustrate a configuration of pixels according to some embodiments. However, the control electrode 111 which makes up the fourth charge transfer unit 7 is configured so as to transfer the electrons of the first holding unit 10. For example, with a top view, the control electrode 111 is disposed so as to be adjacent to the N-type semiconductor region 103 which makes up the first holding unit 10. Also, the OFD area 112 is configured to include an N-type semiconductor region to which the electrons from the first holding unit 10 are discharged. The OFD area 112 may be shared with the source or drain of one of the reset transistor, selecting transistor, or amplifier transistor. Specifically, the charge of the first holding unit 10 is transferred to the source or drain of one of the reset transistor, selecting transistor, or amplifier transistor. Also, the fourth charge transfer unit 7 may be a MOS transistor configured of the control electrode 111, N-type semiconductor region 103, and OFD area 112.

With some embodiments, the charge of the photoelectric conversion unit 8 may be passed through the semiconductor region below the control electrode 102 and transferred to the first holding unit 10. Specifically, a path where charge is transferred from the photoelectric conversion unit 8 to the first holding unit 10 may be disposed below the control electrode 102. The charge of the first holding unit 10 may be passed through the semiconductor region below the control electrode 102 and transferred to the second holding unit 12. Specifically, a path where charge is transferred from the first holding unit 10 to the second holding unit 12 may be disposed below the control electrode 104. Also, the charge of the first holding unit 10 may be passed through the semiconductor region below the control electrode 111 and discharged to the OFD area 112. Specifically, a path where charge is discharged from the first holding unit 10 may be disposed below the control electrode 111. In this manner, the charge of the first holding unit 10 may be discharged via a path different from both of a transfer path of charge from the photoelectric conversion unit 8 to the first holding unit 10 and a transfer path of charge from the first holding unit 10 to the second holding unit 12.

A plug is connected to the OFD area 112. The OFD area 112 is connected to the wiring 16 to which predetermined voltage has been supplied via the plug. The plug may be configured of metal such as tungsten or the like. The predetermined voltage is power supply voltage, for example.

Next, a driving method according to the present embodiment will be described. The driving method according to the present embodiment is the same as with the first embodiment. Specifically, FIG. 6 illustrates driving pulses of the image pickup apparatus according to the present embodiment. However, the driving pulse PTX4 to be supplied to the fourth charge transfer unit 7 may be maintained in a low level at the point-in-time t5, and make the transition from a low level to a high level at the point-in-time t6 and thereafter. For example, the PTX4 makes the transition from a low level to a high level at point-in-time between the point-in-time t6 and the point-in-time t7.

Also, the PTX1 may be in a high level during a period for the PTX4 being in high level. Thus, electrons generated at the photoelectric conversion unit 8 are moved to the first holding unit 10, and the electrons at the first holding unit 10 are discharged to the OFD area 112. That is to say, electrons generated by photoelectric conversion are not accumulated and discharged. In this manner, with some embodiments, when the first charge transfer unit 9 and fourth charge transfer unit 7 are in an conductive state, a shutter operation is enabled. Note that an exposure period is started by the PTX1 and PTX4 at all of the rows disposed in the image pickup apparatus making the transition from a high level to a low level.

With some embodiments, electrons at the first holding unit 10 may be discharged to the OFD area 112 before an exposure period starts. Preferably, all electrons in the first holding unit 10 are discharged before the exposure period starts. Accordingly, when starting accumulation of electrons at the first holding unit 10, electrons remaining in the first holding unit 10 may be reduced or may completely be discarded. As a result thereof, noise may be reduced, and accordingly, image quality may be improved.

Next, suitable potential states according to some embodiments will be described. When the first charge transfer unit 9 and fourth charge transfer unit 7 are in a non-conductive state, it is desirable that the potential of the fourth charge transfer unit 7 is higher than the potential of the first charge transfer unit 9. Also, when the first charge transfer unit 9 and fourth charge transfer unit 7 are in a non-conductive state, it is desirable that the potential of the first holding unit 10 is lower than the potential of the photoelectric conversion unit 8. Thus, electrons generated by photoelectric conversion are held at the photoelectric conversion unit 8 and first holding unit 10.

Note that, in the event that the potential of the first charge transfer unit 9 is higher than the potential of the photoelectric conversion unit 8, small amount of electrons is accumulated in the photoelectric conversion unit 8 alone. In this case, in the event that certain amount of electrons is generated at the photoelectric conversion unit 8, the electrons climb over a potential barrier generated at the first charge transfer unit 9 and move to the first holding unit 10. That is to say, in the event that predetermined or more amount of light has been input, the photoelectric conversion unit 8 and first holding unit 10 hold electrons during an exposure period.

When the first charge transfer unit 9 and fourth charge transfer unit 7 are in an conductive state, it is desirable that the potential of the fourth charge transfer unit 7 is lower than the potential of the first charge transfer unit 9. Thus, electrons generated at the photoelectric conversion unit 8 may move to the first holding unit 10. Next, the electrons at the first holding unit 10 are discharged to the OFD area 112. At this time, it is desirable that the potential barrier at the fourth charge transfer unit 7 is lower than the potential of the photoelectric conversion unit 8. According to such a potential state, electrons generated at the photoelectric conversion unit 8 may move to the OFD area 112. In this manner, the electrons at the first holding unit 10 are discharged to the OFD area 112. That is to say, the first holding unit 10 may be reset.

With some embodiments, the fourth charge transfer unit 7 is connected to the first holding unit 10, electrons at the first holding unit 10 are readily discharged. This is apparent in the event that the potential of the photoelectric conversion unit 8 is higher. This is because it is difficult to discharge electrons at the first holding unit 10 via the photoelectric conversion unit 8.

Also, with some embodiments, when the second charge transfer unit 11 is in an conductive state, the potential of the second holding unit 12 may be lower than the potential of the first holding unit 10. According to such a potential state, transfer of charge from the first holding unit 10 to the second holding unit 12 may effectively be performed. Alternatively, according to such a potential state, complete depletion transfer from the first holding unit 10 to the second holding unit 12 is enabled. The complete depletion transfer means that charge is transferred by the entirety of the N-type semiconductor region 103 which makes up the first holding unit 10 being depleted.

With a configuration wherein when the second charge transfer unit 11 is in an conductive state, the potential of the second holding unit 12 is lower than the potential of the first holding unit 10, it is desirable that a reset unit is connected to the input node 14 of the amplifier element 15. Thus, charge at the second holding unit 12 may be discharged via the input node 14 of the amplifier element 15. That is to say, the second holding unit 12 may be reset via the input node 14 of the amplifier element 15. This is because the potential of the first holding unit 10 is higher, and accordingly, it is difficult to discharge electrons at the second holding unit 12 via the first holding unit 10.

Also, at the second holding unit 12, a period for holding electrons differs depending on rows. Therefore, when noise generated at the second holding unit 12 is great, this causes shading, and image quality may be deteriorated. On the other hand, noise to be generated at the second holding unit 12 may be reduced by reducing the number of channels to be connected to the second holding unit 12. The channels are transfer paths for charge where the potential is controlled. Specifically, it is desirable that the number of channels to be connected to the second holding unit 12 is two. One is a transfer path for charge from the first holding unit 10 to the second holding unit 12. The other is a transfer path for charge from the second holding unit 12 to the input node 14. Note that this may be another path where charge overflowing from the second holding unit 12 moves.

As described above, with some embodiments, when any of the first charge transfer unit 9, second charge transfer unit 11, and third charge transfer unit 13 is in a non-conductive state, the potential of the first holding unit 10 is higher than the potential of the second holding unit 12. According to such a configuration, transfer of charge from the first holing unit 10 to the second holding unit 12 may effectively be performed.

Also, with some embodiments, charge at the first holding unit 10 may be discharged. According to such a configuration, the image quality of an image pickup apparatus may be improved.

Third Embodiment

Another embodiment of the image pickup apparatus will be described. The present embodiment differs from the first embodiment in that the lower end of the N-type semiconductor region 103 which makes up the first holding unit 10 is in a position shallower than the lower end of the N-type semiconductor region 105 which makes up the second holding unit 12. The other portions are all the same as with the first embodiment or second embodiment. Accordingly, with the present embodiment, points alone different from the first and second embodiments will be described, and description will be omitted regarding the other portions.

The overall block configuration of the image pickup apparatus according to the present embodiment is the same as with the first or second embodiment. Specifically, FIG. 1 is an overall block diagram of the image pickup apparatus according to the present embodiment.

An equivalent circuit of the image pickup apparatus according to the present embodiment is the same as with the first or second embodiment. Specifically, FIG. 2 or 11 illustrates an equivalent circuit of the image pickup apparatus according to the present embodiment.

The top view according to the present embodiment is the same as with the first or second embodiment. Specifically, FIG. 3 illustrates a top view of the image pickup apparatus according to the present embodiment.

Figure 12:
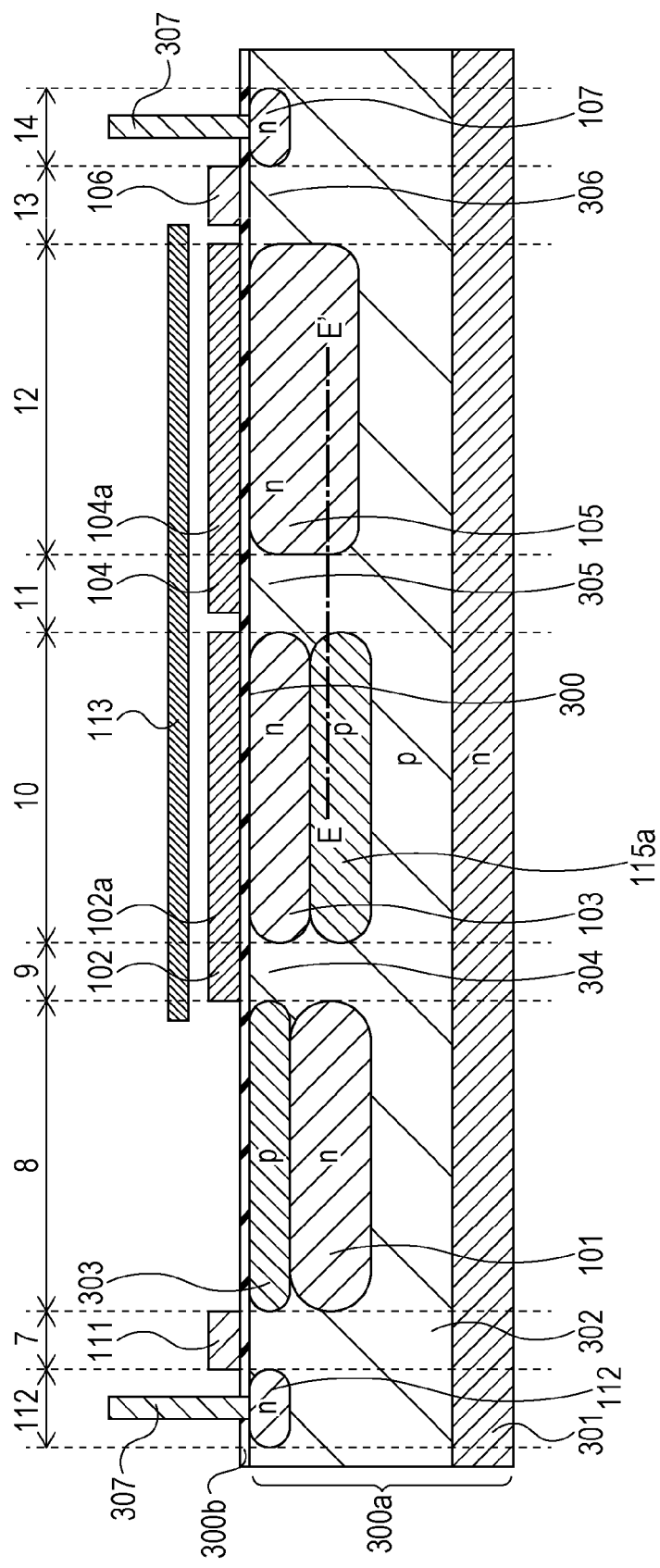
FIG. 12 is a schematic view of the cross section of an embodiment of the image pickup apparatus.

FIG. 12 is a schematic view illustrating a cross section along the line XII-XII in FIG. 3. Portions having the same functions as with FIG. 4 are denoted with the same reference numerals, and detailed description will be omitted.

With some embodiments, the lower end of the N-type semiconductor region 103 is disposed in a position near the interface 300 as compared to the lower end of the N-type semiconductor region 105. The lower end of the N-type semiconductor region 103 is in a shallower position. As for another point of view, with predetermined depth (depth of E-E') from the interface 300, a P-type semiconductor region is disposed in the first holding unit 10, and the N-type semiconductor region 105 is disposed in the second holding unit 12. Therefore, when the first charge transfer unit 9, second charge transfer unit 11, and third charge transfer unit 13 are in a non-conductive state, i.e., in a state in which the potential of each of the channels is high, the potential of the first holding unit 10 is higher than the potential of the second holding unit 12. This is because when all of the N-type semiconductor regions 103 and 105 are depleted, great reverse bias may be applied by the N-type semiconductor region 105 which extends more deeply.

With some embodiments, both of the N-type semiconductor regions 103 and 105 extend to the interface 300. However, a P-type semiconductor region may be disposed between the N-type semiconductor region 103 and the interface 300 and between the N-type semiconductor region 105 and the interface 300.

Also, with some embodiments, the impurity concentration of the N-type semiconductor region 103 and the impurity concentration of the N-type semiconductor region 105 may be the same. As with the first embodiment, the impurity concentration of the N-type semiconductor region 103 may be lower than the impurity concentration of the N-type semiconductor region 105.

In FIG. 12, the N-type semiconductor region 103 makes up a PN junction along with the P-type semiconductor region 115a. The lower end of the N-type semiconductor region 103 may be a PN junction surface between the N-type semiconductor region 103 and the P-type semiconductor region 115a disposed below the N-type semiconductor region 103.

On the other hand, the N-type semiconductor region 105 makes up a PN junction along with the P-type semiconductor region 302. That is to say, FIG. 12 illustrates an example wherein the P-type semiconductor region 115b according to the first embodiment has been omitted. The lower end of the N-type semiconductor region 105 may be a PN junction surface between the N-type semiconductor region 105 and the P-type semiconductor region 302 disposed below the N-type semiconductor region 105.

According to such a configuration, the lower end of the N-type semiconductor region 103 may be in a position shallower than the lower end of the N-type semiconductor region 105 according to depth where the P-type semiconductor region 115a is formed. Accordingly, the N-type semiconductor regions 103 and 105 may be formed by ion injection employing one mask, and accordingly, the manufacturing process may be simplified.

Note that, with some embodiments, the P-type semiconductor region 115a may be omitted. In the event that the P-type semiconductor region 115a is omitted, the N-type semiconductor regions 103 and 105 are formed by ion injection with different energy, and accordingly, the lower end of the N-type semiconductor region 103 may be in a position shallower than the lower end of the N-type semiconductor region 105.

Alternatively, the P-type semiconductor region 115b of which the impurity concentration is higher than that of the P-type semiconductor region 302 may be disposed at the bottom of the N-type semiconductor region 105. In this case, the P-type semiconductor regions 115a and 115b have to be formed by different ion injection.

A driving method according to some embodiments is the same as with the first or second embodiment. Specifically, FIG. 6 illustrates driving pulses according to some embodiments. Also, potential states of pixels according to some embodiments are the same as with the first or second embodiment. Specifically, FIGS. 7A to 10 illustrate potential states according to some embodiments.

As described above, with some embodiments, when any of the first charge transfer unit 9, second charge transfer unit 11, and third charge transfer unit 13 is in a non-conductive state, the potential of the first holding unit 10 is higher than the potential of the second holding unit 12. According to such a configuration, transfer of charge from the first holing unit 10 to the second holding unit 12 may effectively be performed.

Also, with some embodiments, the lower end of the N-type semiconductor region 103 is in a position shallower than the lower end of the N-type semiconductor region 105. According to such a configuration, increasing the potential of the first holding unit 10 as compared to the potential of the second holding unit 12 is facilitated.

Fourth Embodiment

Another embodiment of the image pickup apparatus will be described. The present embodiment differs from the first to third embodiments regarding the configuration of the N-type semiconductor region 103 which makes up the first holding unit 10. Therefore, points alone different from the first to third embodiments will be described. Description will be omitted regarding the same portions as with one of the first to third embodiments.

The overall block configuration of the image pickup apparatus according to the present embodiment is the same as with the first or second embodiment. Specifically, FIG. 1 is an overall block diagram of the image pickup apparatus according to the present embodiment.

An equivalent circuit of the image pickup apparatus according to the present embodiment is the same as with the first or second embodiment. Specifically, FIG. 2 or 11 illustrates an equivalent circuit of the image pickup apparatus according to the present embodiment.

A specific configuration of pixels according to some embodiments will be described with reference to FIGS. 13 to 14B. Portions having the same function as with FIGS. 3 and 4 are denoted with the same reference numerals, and detailed description will be omitted.

Figure 13:
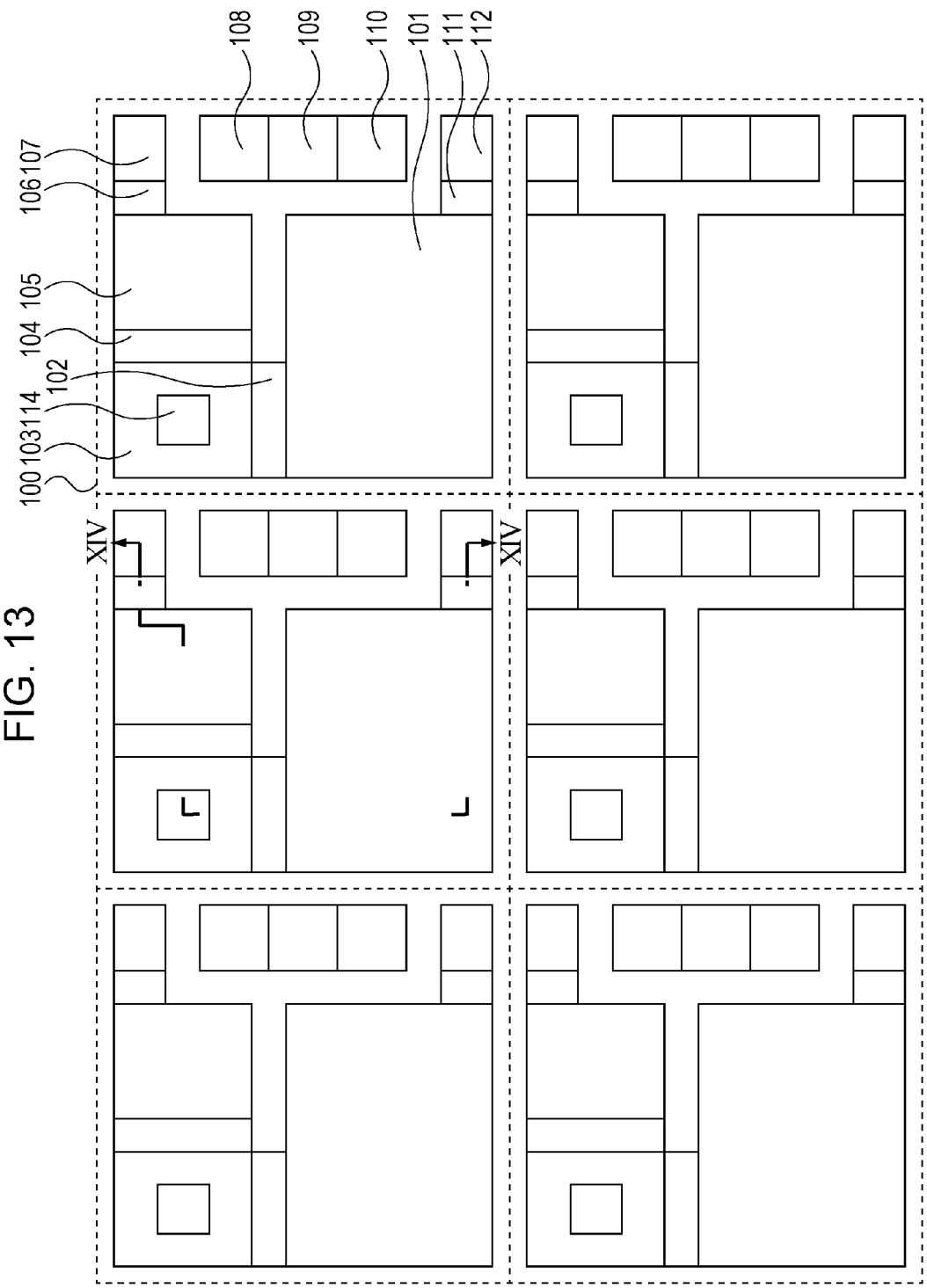
FIG. 13 is a schematic view illustrating the top face of an embodiment of an image pickup apparatus.

FIG. 13 illustrates a top view of the image pickup apparatuses according to some embodiments. Here, though six pixels in a total of two rows by three columns are illustrated, an image pickup area may be configured by an even greater number of pixels being disposed.

A feature of some embodiments is in that a P-type semiconductor region 114 is disposed in the pixels 100. As illustrated in FIG. 13, as viewed at a certain planar surface, a portion of the N-type semiconductor region 103 is disposed between the P-type semiconductor region 114 and the control electrode 102. Also, anther portion of the N-type semiconductor region 103 is disposed between the P-type semiconductor region 114 and the control electrode 104. Or, the N-type semiconductor region 103 may surround the P-type semiconductor region 114.

Disposing the P-type semiconductor region 114 in the first holding unit 10 facilitates to decrease the potential of the first holding unit 10 as compared to the potential of the second holding unit 12. Alternatively, transfer of charge of the first holding unit 10 may be performed with lower voltage. The second holding unit 12 is allowed to transfer charge using voltage from the FD area 107, and accordingly, charge may readily be transferred.

Figure 14A:
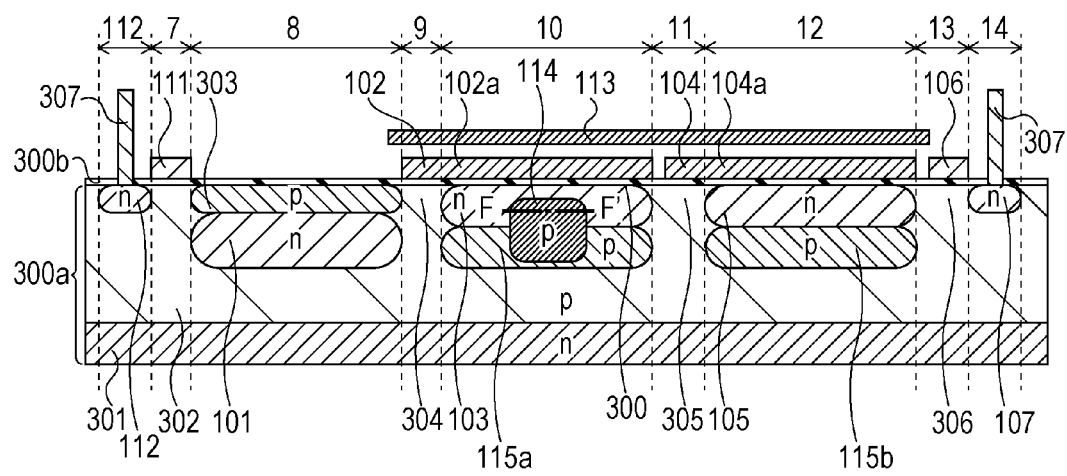
FIGS. 14A and 14B are schematic views of the cross section of an embodiment of the image pickup apparatus.
Figure 14B:
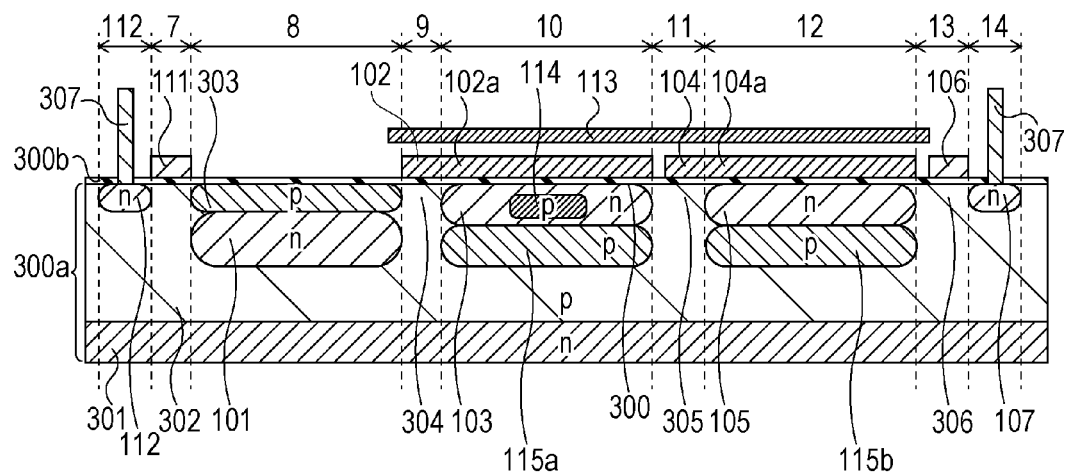

FIGS. 14A and 14B are schematic views illustrating a cross section along the line XIV-XIV in FIG. 13. Portions having the same functions as with FIG. 4 are denoted with the same reference numerals, and detailed description will be omitted. As some embodiments, an example of two cross-sectional configurations of FIGS. 14A and 14B is illustrated. FIGS. 14A and 14B are the same except that the configuration of the P-type semiconductor region 114 differs.

With some embodiments, the P-type semiconductor region 114 is disposed below the N-type semiconductor region 103. Specifically, a portion of the N-type semiconductor region 103 which makes up the first holding unit 10 is disposed between the P-type semiconductor region 114 and the interface 300. The interface 300 is a surface where the semiconductor substrate 300a is in contact with the insulating film 300b.

As illustrated in FIGS. 14A and 14B, with a plane including line F-F' parallel to the interface 300, a portion (first portion) of the N-type semiconductor region 103 is disposed between the P-type semiconductor region 114 and the first charge transfer unit 9. Also, with the plane including the line F-F', a portion (second portion) of the N-type semiconductor region 103 is disposed between the P-type semiconductor region 114 and the second charge transfer unit 11.

Preferably, the P-type semiconductor region 114 is surrounded with the N-type semiconductor region 103. That is to say, at the depth-wise direction in the drawing, the N-type semiconductor region 103 is disposed adjacent to the P-type semiconductor region 114, and at the closer side thereof, the N-type semiconductor region 103 is disposed adjacent to the P-type semiconductor region 114. In this manner, at the depth indicated with line E-E', the P-type semiconductor region 114a may be surrounded with the N-type semiconductor region 103.

With the example illustrated in FIG. 14A, of the P-type semiconductor region 114a, a portion disposed in a deep position of the semiconductor substrate 300a is not surrounded with the N-type semiconductor region 103. That is to say, the P-type semiconductor region 114a extents deeper than the lower end of the N-type semiconductor region 103. The lower end of the N-type semiconductor 103 is a PN junction surface with the P-type semiconductor region 115a, for example.

With the example illustrated in FIG. 14B, distance from the interface 300 to the lower end of the P-type semiconductor region 114a is shorter than distance from the interface 300 to the lower end of the N-type semiconductor region 103. That is to say, a portion of the N-type semiconductor region 103 is disposed below the P-type semiconductor region 114a. Note that the lower end of the P-type semiconductor region 114a is a PN junction surface with the N-type semiconductor region 103, for example. The lower end of the N-type semiconductor region 103 is a PN junction surface with the P-type semiconductor region 115a, for example.

The impurity concentration of the P-type semiconductor region 114 may be higher than the impurity concentration of the P-type semiconductor region 302. Alternatively, the impurity concentration of the P-type semiconductor region 114 may be higher than the impurity concentration of the N-type semiconductor region 103. The higher the impurity concentration of the P-type semiconductor region 114 is, the higher the potential of the first holding unit 10 may be increased. Alternatively, voltage to be used for transfer of charge from the first holding unit 10 may be decreased. The impurity concentration of the P-type semiconductor region 114 may be a concentration to the extent almost approximate to an intrinsic semiconductor.

On the other hand, the impurity concentration of the P-type semiconductor region 114 may be lower than the impurity concentration of the P-type semiconductor region 303. Alternatively, the impurity concentration of the P-type semiconductor region 114 may be lower than the impurity concentration of a P-type semiconductor region which makes up a potential barrier which is not illustrated. In the event that the impurity concentration of the P-type semiconductor region 114 is high, the charge holding capacitance of a holding unit may be reduced. Therefore, according to such a configuration, deterioration in the charge holding capacitance of a holding unit may be suppressed.

A driving method according to the present embodiment is the same as with the first to third embodiments. Specifically, FIG. 6 illustrates driving pulses according to the present embodiment. Also, potential states of pixels according to the present embodiment are the same as with the first to third embodiments. Specifically, FIGS. 7A to 10 illustrate potential states according to the present embodiment.

As described above, with some embodiments, when any of the first charge transfer unit 9, second charge transfer unit 11, and third charge transfer unit 13 is in a non-conductive state, the potential of the first holding unit 10 is higher than the potential of the second holding unit 12. According to such a configuration, transfer of charge from the first holing unit 10 to the second holding unit 12 may effectively be performed.

Also, with some embodiments, the P-type semiconductor region 114 is disposed in the first holding unit 10. According to such a configuration, increasing the potential of the first holding unit 10 as compared to the potential of the second holding unit 12 is facilitated.

Also, with some embodiments, the P-type semiconductor region 114 is disposed separately from the interface 300. According to such a configuration, the charge holding capacitance of the first holding unit 10 may be increased. Also, the charge holding capacitance of the first holding unit 10 may be increased by the N-type semiconductor region 103 being disposed below the P-type semiconductor region 114.

Note that the following modification will also be encompassed in embodiments of the disclosure. With a modification, the first portion of the N-type semiconductor region 103 is disposed in the area where the N-type semiconductor region 103 is disposed in FIGS. 13 to 14B. Next, the second portion of the N-type semiconductor region 103 wherein the impurity concentration is lower than that of the first portion, is disposed in the area where the P-type semiconductor region 114 is disposed in FIGS. 13 to 14B.

Also, a P-type semiconductor region 114A may be disposed in the second holding unit 12. A portion of the N-type semiconductor region 105 is disposed between the P-type semiconductor region 114A and the control electrode 104. Next, a portion of the N-type semiconductor region 105 is disposed between the P-type semiconductor region 114A and the control electrode 106. The P-type semiconductor region 114A may be surrounded with the N-type semiconductor region 105.

In this case, when projecting the P-type semiconductor regions 114 and 114A on a certain planar surface, the area of projection of the P-type semiconductor region 114 is greater than the area of projection of the P-type semiconductor region 114A. Alternatively, the impurity concentration of the P-type semiconductor region 114 is higher than the impurity concentration of the P-type semiconductor region 114A. According to such a configuration, increasing the potential of the first holding unit 10 as compared to the potential of the second holding unit 12.

Fifth Embodiment

Figure 15:
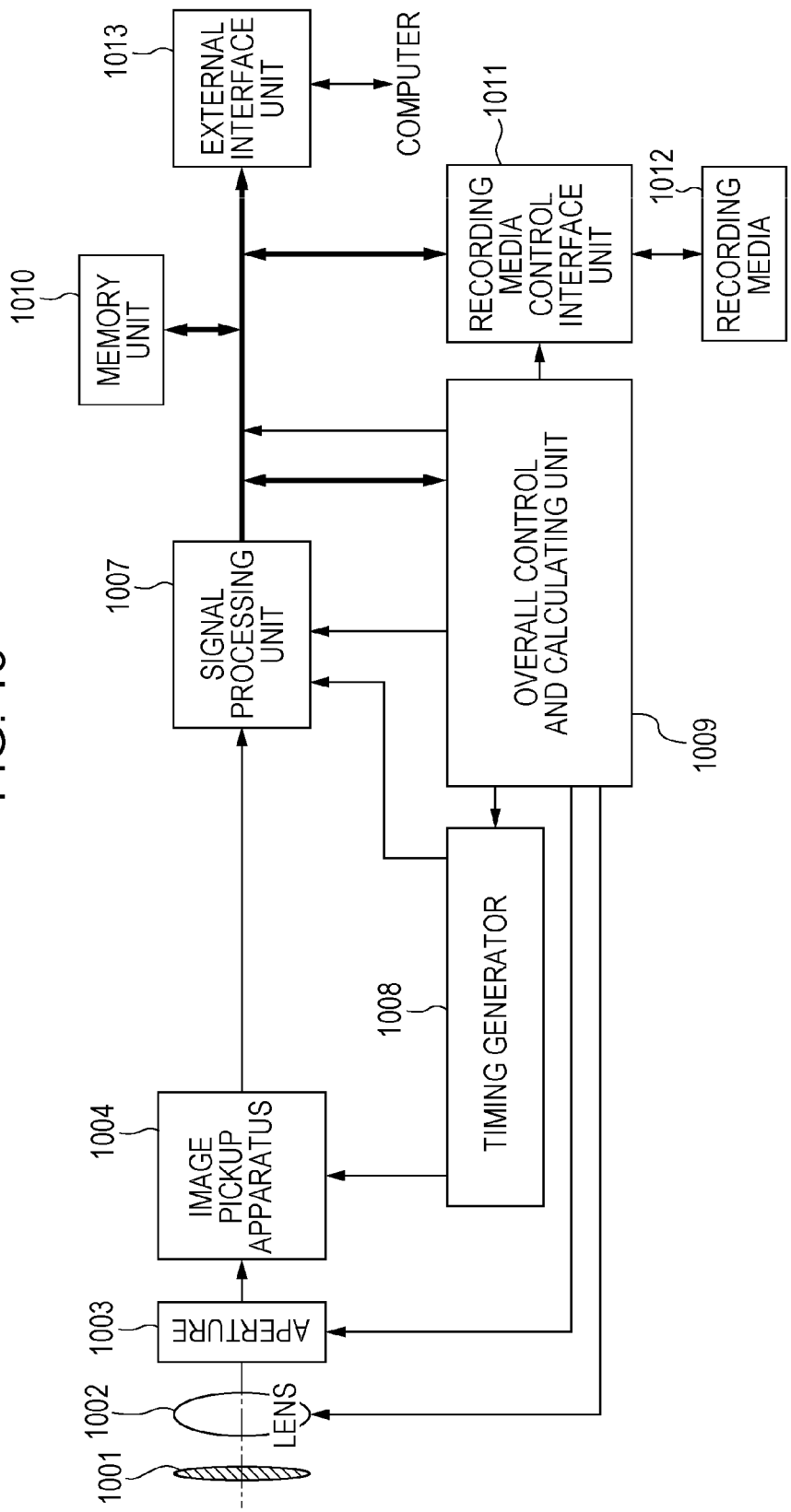
FIG. 15 is a block diagram of an image pickup system.

An embodiment of an image pickup system will be described. Examples of the image pickup system include digital still cameras, digital cam coders, duplicating machines, fax machines, cellular phones, in-vehicle cameras, and observation satellites. FIG. 15 illustrates a block diagram of a digital still camera as an example of the image pickup system.

In FIG. 15, reference numeral 1001 denotes a barrier for protecting a lens, 1002 denotes a lens which causes an image pickup apparatus 1004 to form an optical image of a subject, and 1003 denotes an aperture for varying the amount of light passed through the lens 1002. Reference numeral 1004 denotes an image pickup apparatus described in the above-mentioned embodiments, which converts an optical image formed by the lens 1002 as image data. Now, let us say that an AD conversion unit has been formed on the semiconductor substrate of the image pickup apparatus 1004. Reference numeral 1007 denotes a signal processing unit which subjects image pickup data output from the image pickup apparatus 1004 to various types of corrections, or compresses the data. In FIG. 15, reference numeral 1008 denotes a timing generator which outputs various timing signals to the image pickup apparatus 1004 and signal processing unit 1007, and 1009 denotes an overall control unit which controls the entire digital still camera. Reference numeral 1010 denotes a frame memory unit for temporarily storing image data, 1011 denotes an interface unit for performing recording in or readout from a recording medium, and 1012 denotes a detachable recording medium such as semiconductor memory for recording or readout of image data. Reference numeral 1013 denotes an interface unit for communicating with an external computer or the like. Here, a timing signal and so forth may be input externally from the image pickup system, and the image pickup system may include at least the image pickup apparatus 1004 and the signal processing unit 1007 which processes an image pickup signal output from the image pickup apparatus 1004.

With some embodiments, the configuration has been described wherein the image pickup apparatus 1004 and AD conversion unit are formed on the same semiconductor substrate. However, the image pickup apparatus 1004 and AD conversion unit may be provided to another semiconductor substrate. Also, the image pickup apparatus 1004 and signal processing unit 1007 may be formed on the same substrate.

As described above, the image pickup apparatus according to one or more embodiments may be applied to the image pickup system. The image pickup system may be driven with low voltage by applying the image pickup apparatus according to one or more embodiments to the image pickup system.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2012-033363 filed Feb. 17, 2012 which is hereby incorporated by reference herein in its entirety.

What is claimed is:

1. An image pickup apparatus comprising:
 a plurality of pixels;
 wherein each of the plurality of pixels includes
  a photoelectric conversion unit, and
  an amplifier element configured to output a signal based on charge generated by the photoelectric conversion unit;
 wherein, within an electric path between the photoelectric conversion unit and an input node of the amplifier element, there are disposed a first holding unit, a second holding unit disposed in a subsequent stage of the first holding unit, a first transfer unit configured to transfer charge to the first holding unit, a second transfer unit configured to transfer charge of the first holding unit to the second holding unit, and a third transfer unit configured to transfer charge of the second holding unit;
 wherein the first holding unit includes a first conductive-type first semiconductor region which holds charge;

wherein the second holding unit includes a first conductive-type second semiconductor region which holds charge; and wherein impurity concentration of the first semiconductor region is lower than impurity concentration of the second semiconductor region.

2. An image pickup apparatus comprising:
a plurality of pixels;
wherein each of the plurality of pixels includes
a photoelectric conversion unit, and
an amplifier element configured to output a signal based on charge generated by the photoelectric conversion unit;
wherein, within an electric path between the photoelectric conversion unit and an input node of the amplifier element, there are disposed a first holding unit, a second holding unit disposed in a subsequent stage of the first holding unit, a first transfer unit configured to transfer charge to the first holding unit, a second transfer unit configured to transfer charge of the first holding unit to the second holding unit, and a third transfer unit configured to transfer charge of the second holding unit;
wherein the first holding unit includes a first conductive-type first semiconductor region which holds charge;
wherein the second holding unit includes a first conductive-type second semiconductor region which holds charge;
wherein a lower end of the first semiconductor region is disposed in a shallower position than a lower end of the second semiconductor region.

3. An image pickup apparatus comprising:
a plurality of pixels;
wherein each of the plurality of pixels includes
a photoelectric conversion unit, and
an amplifier element configured to output a signal based on charge generated by the photoelectric conversion unit;
wherein, within an electric path between the photoelectric conversion unit and an input node of the amplifier element, there are disposed a first holding unit, a second holding unit disposed in a subsequent stage of the first holding unit, a first transfer unit configured to transfer charge to the first holding unit, a second transfer unit configured to transfer charge of the first holding unit to the second holding unit, and a third transfer unit configured to transfer charge of the second holding unit;
wherein the first holding unit includes a first conductive-type first semiconductor region which holds charge;
wherein the second holding unit includes a first conductive-type second semiconductor region which holds charge; and
wherein the first semiconductor region includes
a first portion, and
a second portion of which impurity concentration is lower than that of the first portion.

4. An image pickup apparatus comprising:
a plurality of pixels;
wherein each of the plurality of pixels includes
a photoelectric conversion unit, and
an amplifier element configured to output a signal based on charge generated by the photoelectric conversion unit;
wherein, within an electric path between the photoelectric conversion unit and an input node of the amplifier element, there are disposed a first holding unit, a second holding unit disposed in a subsequent stage of the first holding unit, a first transfer unit configured to transfer charge to the first holding unit, a second transfer unit configured to transfer charge of the first holding unit to the second holding unit, and a third transfer unit configured to transfer charge of the second holding unit;
wherein the first holding unit includes a first conductive-type first semiconductor region which holds charge;
wherein the second holding unit includes a first conductive-type second semiconductor region which holds charge;
wherein the image pickup apparatus further comprises:
a second conductive-type third semiconductor region;
wherein, at a depth where the third semiconductor region is disposed, a first portion of the first semiconductor region is disposed between the third semiconductor region and the first transfer unit; and
wherein, at the depth where the third semiconductor region is disposed, a second portion of the first semiconductor region is disposed between the third semiconductor region and the second transfer unit.

5. An image pickup apparatus comprising:
a plurality of pixels;
wherein each of the plurality of pixels includes
a photoelectric conversion unit, and
an amplifier element configured to output a signal based on charge generated by the photoelectric conversion unit;
wherein, within an electric path between the photoelectric conversion unit and an input node of the amplifier element, there are disposed a first holding unit, a second holding unit disposed in a subsequent stage of the first holding unit, a first transfer unit configured to transfer charge to the first holding unit, a second transfer unit configured to transfer charge of the first holding unit to the second holding unit, and a third transfer unit configured to transfer charge of the second holding unit;
wherein the first holding unit includes a first conductive-type first semiconductor region which holds charge;
wherein the second holding unit includes a first conductive-type second semiconductor region which holds charge; and
wherein when the first transfer unit, the second transfer unit, and the third transfer unit are in a non-conductive state, potential of the first semiconductor region is higher than potential of the second semiconductor region.

6. An image pickup system comprising:
the image pickup apparatus according to claim 1; and
a signal processing unit configured to process a signal output from the image pickup apparatus.

* * * * *